US012625433B2

(12) United States Patent
Kubota et al.

(10) Patent No.: US 12,625,433 B2
(45) Date of Patent: May 12, 2026

(54) SPATIAL LIGHT MODULATION UNIT AND EXPOSURE APPARATUS

(71) Applicant: NIKON CORPORATION, Tokyo (JP)

(72) Inventors: Yasuhito Kubota, Saitama (JP); Yasushi Mizuno, Saitama (JP); Masaki Kato, Yokohama (JP); Masaki Nishimura, Tokyo (JP); Hitoshi Mizuno, Yokohama (JP)

(73) Assignee: NIKON CORPORATION, Tokyo (JP)

( * ) Notice: Subject to any disclaimer, the term of this patent is extended or adjusted under 35 U.S.C. 154(b) by 63 days.

(21) Appl. No.: 18/394,369

(22) Filed: Dec. 22, 2023

(65) Prior Publication Data

US 2024/0126176 A1     Apr. 18, 2024

Related U.S. Application Data

(63) Continuation of application No. PCT/JP2022/026503, filed on Jul. 1, 2022.

(30) Foreign Application Priority Data

Jul. 5, 2021     (JP) ................................. 2021-111623

(51) Int. Cl.
*G03F 7/00*               (2006.01)
(52) U.S. Cl.
CPC ...... *G03F 7/70291* (2013.01); *G03F 7/70358* (2013.01); *G03F 7/70525* (2013.01)
(58) Field of Classification Search
CPC ............. G03F 7/70291; G03F 7/70358; G03F 7/70525; G03F 7/20; G03F 7/70116;
(Continued)

(56) References Cited

U.S. PATENT DOCUMENTS 7,227,613 B2 *   6/2007   Ryzhikov ............ G03F 7/70283
                                                            355/53
8,130,364 B2 *   3/2012   Kumazawa ......... G03F 7/70475
                                                            355/53
(Continued)

FOREIGN PATENT DOCUMENTS

JP       2003-345030 A     12/2003
JP       2005-266779 A      9/2005
(Continued)

OTHER PUBLICATIONS

Sep. 20, 2022 International Search Report issued in International Patent Application No. PCT/JP2022/026503.
(Continued)

*Primary Examiner* — Deoram Persaud

(74) *Attorney, Agent, or Firm* — OLIFF PLC

(57)                 ABSTRACT

A spatial light modulation unit is used in an exposure apparatus that exposes an exposure pattern onto a photosensitive substrate while moving the photosensitive substrate in a scan direction. The spatial light modulation unit includes: a spatial light modulator having a plurality of elements; a controller that controls the plurality of elements in accordance with the exposure pattern; and a SLM substrate on which the spatial light modulator and the controller are provided. The controller is arranged side by side in the scan direction with respect to the spatial light modulator.

26 Claims, 14 Drawing Sheets

(58) Field of Classification Search
CPC ............. G03F 7/70508; G03F 7/70875; G03F
7/70891; G02B 26/0858; G02B 7/1815
See application file for complete search history.

(56) References Cited

U.S. PATENT DOCUMENTS

| | | | | |
|---|---|---|---|---|
| 8,294,874 | B2 * | 10/2012 | Kono | G03B 27/70 |
| | | | | 355/70 |
| 10,474,041 | B1 * | 11/2019 | Zhao | G03F 7/70641 |
| 2002/0039180 | A1 * | 4/2002 | Furter | G03F 7/70358 |
| | | | | 250/548 |
| 2008/0165333 | A1 * | 7/2008 | Kumazawa | G03F 7/70791 |
| | | | | 355/53 |
| 2009/0009735 | A1 * | 1/2009 | Kato | G02B 17/0892 |
| | | | | 359/364 |
| 2009/0296170 | A1 * | 12/2009 | Sumi | G03F 7/70291 |
| | | | | 358/494 |
| 2015/0015859 | A1 | 1/2015 | Yun et al. | |
| 2017/0017165 | A1 * | 1/2017 | Bencher | G03F 7/70275 |
| 2018/0088319 | A1 | 3/2018 | Atwood et al. | |
| 2023/0221521 | A1 * | 7/2023 | Thomas | G02B 7/1821 |
| | | | | 353/52 |

FOREIGN PATENT DOCUMENTS

| | | | |
|---|---|---|---|
| JP | 2006-267472 | A | 10/2006 |
| JP | 2006-343684 | A | 12/2006 |
| JP | 2013-197452 | A | 9/2013 |
| JP | 2015-144156 | A | 8/2015 |
| KR | 10-2015-0007369 | A | 1/2015 |
| KR | 10-2017-0106918 | A | 9/2017 |
| KR | 10-2018-0034220 | A | 4/2018 |

OTHER PUBLICATIONS

Sep. 20, 2022 Written Opinion issued in International Patent Application No. PCT/JP2022/026503.
Nov. 5, 2024 Office Action issued in Japanese Patent Application No. 2023-533112.
Apr. 22, 2025 Office Action issued in Japanese Patent Application No. 2023-533112.
"DMD DiscoveryTM 1100 Controller Board & Starter Kit"; Texas Instruments Incorporated; Mar. 2006; https://archive.org/details/manualzilla-id-5821688/mode/2up.
"DMD Discovery TM 1100 Controller Board & Starter Kit"; Technical Reference Manual; TIDN 2506006 Rev D; Jan. 2004.
Jun. 25, 2025 Office Action issued in Korean Patent Application No. 10-2023-7042454.
Mar. 24, 2026 Office Action issues in Taiwanese Patent Application No. 111124762.

* cited by examiner

SPATIAL LIGHT MODULATION UNIT AND EXPOSURE APPARATUS

CROSS-REFERENCE TO RELATED APPLICATION

This is a Continuation Application of International Application No. PCT/JP2022/026503, filed on Jul. 1, 2022, which claims priority on Japanese Patent Application No. 2021-111623, filed on Jul. 5, 2021. The contents of the aforementioned applications are incorporated herein by reference.

BACKGROUND

Field of the Invention

The present invention relates to a spatial light modulation unit and an exposure apparatus.

BACKGROUND

In the related art, as an exposure apparatus that illuminates a substrate with illumination light via an optical system, an exposure apparatus is known that performs an exposure by causing light which is modulated by using a spatial light modulator to pass through a projection optical system and forming an image by the light onto a resist applied to the substrate (for example, refer to Japanese Unexamined Patent Application, First Publication No. 2005-266779).

SUMMARY

An aspect of the present invention is a spatial light modulation unit used in an exposure apparatus that exposes an exposure pattern onto a photosensitive substrate while moving the photosensitive substrate in a scan direction, the spatial light modulation unit including: a spatial light modulator having a plurality of elements; a controller that controls the plurality of elements in accordance with the exposure pattern; and a SLM substrate on which the spatial light modulator and the controller are provided, wherein the controller is arranged side by side in the scan direction with respect to the spatial light modulator.

Another aspect of the present invention is a spatial light modulation unit used in an exposure apparatus that exposes an exposure pattern onto a photosensitive substrate while moving the photosensitive substrate in a scan direction, the spatial light modulation unit including: a spatial light modulator having a plurality of elements; a controller that controls the spatial light modulator in accordance with the exposure pattern; a supply portion that supplies electric power to the spatial light modulator and the controller; and a SLM substrate on which the spatial light modulator and the controller are provided, wherein the SLM substrate includes: a first substrate on which the spatial light modulator is provided and to which a section of the supply portion is connected; and a second substrate on which the controller is provided and to which another section of the supply portion is connected, and a second plane on which the controller is provided of the second substrate crosses with a first plane on which the spatial light modulator is provided of the first substrate.

An still another aspect of the present invention is a spatial light modulation unit used in an exposure apparatus that exposes an exposure pattern onto a photosensitive substrate while moving the photosensitive substrate in a scan direction, the spatial light modulation unit including: a spatial light modulator having a plurality of elements; a controller that controls the spatial light modulator in accordance with the exposure pattern; a SLM substrate on which the spatial light modulator and the controller are provided; and a heat sink, wherein the spatial light modulator is provided on a front side surface of the SLM substrate, the controller is provided on a rear side surface of the SLM substrate, and the heat sink is in contact with the controller.

A still another aspect of the present invention is an exposure apparatus including: a spatial light modulation unit that includes a spatial light modulator having a plurality of elements, a controller that controls the plurality of elements, and a SLM substrate on which the spatial light modulator and the controller are provided; a substrate stage that holds a photosensitive substrate and moves in a scan direction relative to the spatial light modulation unit; and a projection optical system that projects an image of a pattern formed by the plurality of elements controlled by the controller onto the photosensitive substrate, wherein the controller is provided on the SLM substrate side by side in the scan direction with respect to the spatial light modulator.

A still another aspect of the present invention provides an exposure apparatus including: an illumination optical system; a spatial light modulator that is illuminated with light from the illumination optical system; a projection optical system that illuminates a substrate with light emitted from the spatial light modulator; and a stage that holds the substrate, wherein the illumination optical system and the spatial light modulator are arranged side by side in the scan direction.

A still another aspect of the present invention provides an exposure apparatus including: a stage that moves a substrate in a scan direction; a spatial light modulator; an illumination optical system that illuminates the spatial light modulator from the scan direction; and a projection optical system that illuminates the substrate with light reflected by a mirror of the spatial light modulator, wherein the mirror of the spatial light modulator is tilted relative to the scan direction.

BRIEF DESCRIPTION OF THE DRAWINGS

FIG. 5 is a plan view of a plurality of aligned spatial light modulation units according to the first embodiment.

FIG. 14 is an expansion plan view of a modification example 2C of the spatial light modulation unit 1 according to the second embodiment.

DESCRIPTION OF EMBODIMENTS

Hereinafter, embodiments will be described in detail with reference to the drawings.

Figure 1:
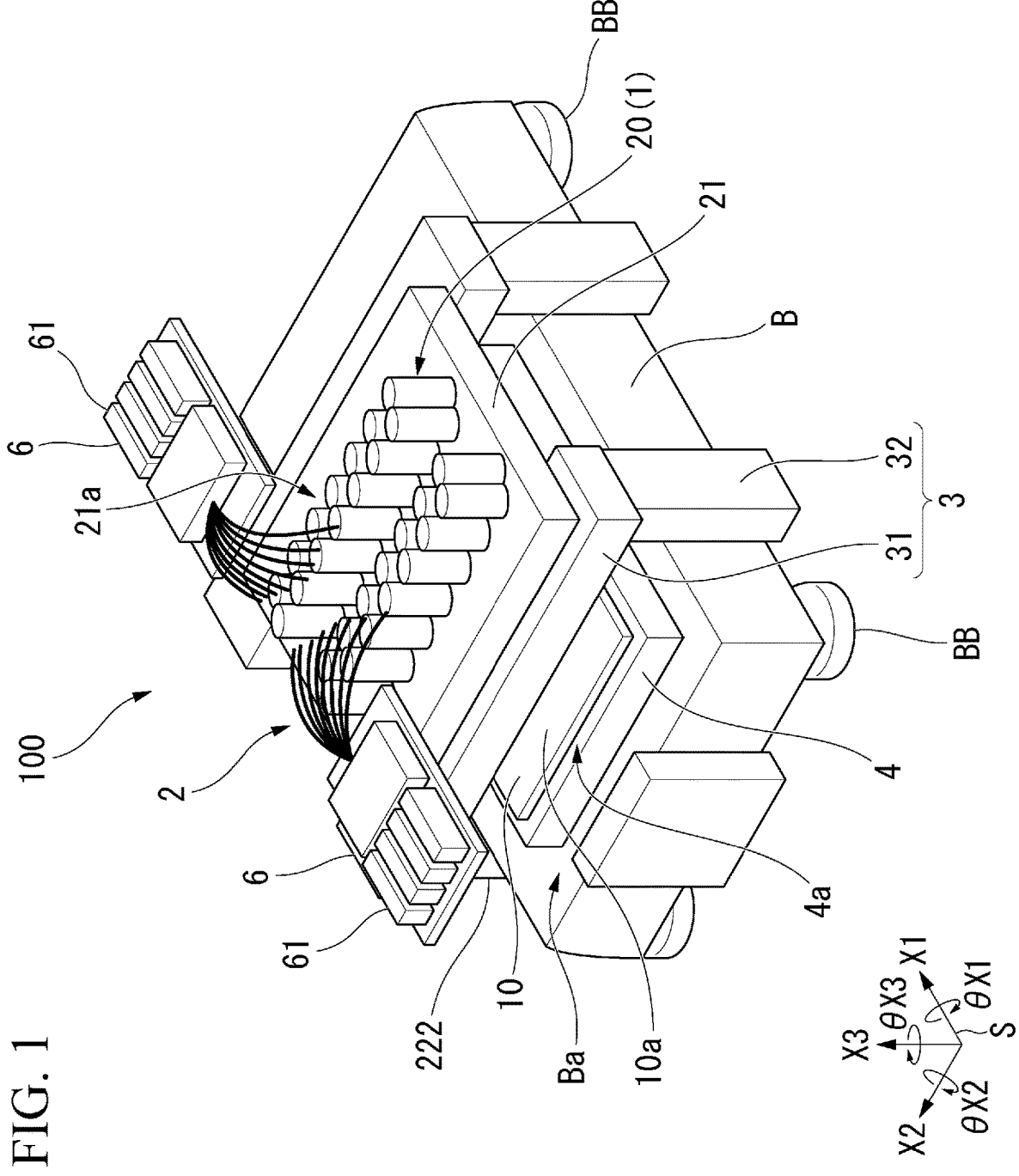
FIG. 1 is a perspective view showing an exposure apparatus using a spatial light modulation unit according to a first embodiment.
Figure 5:
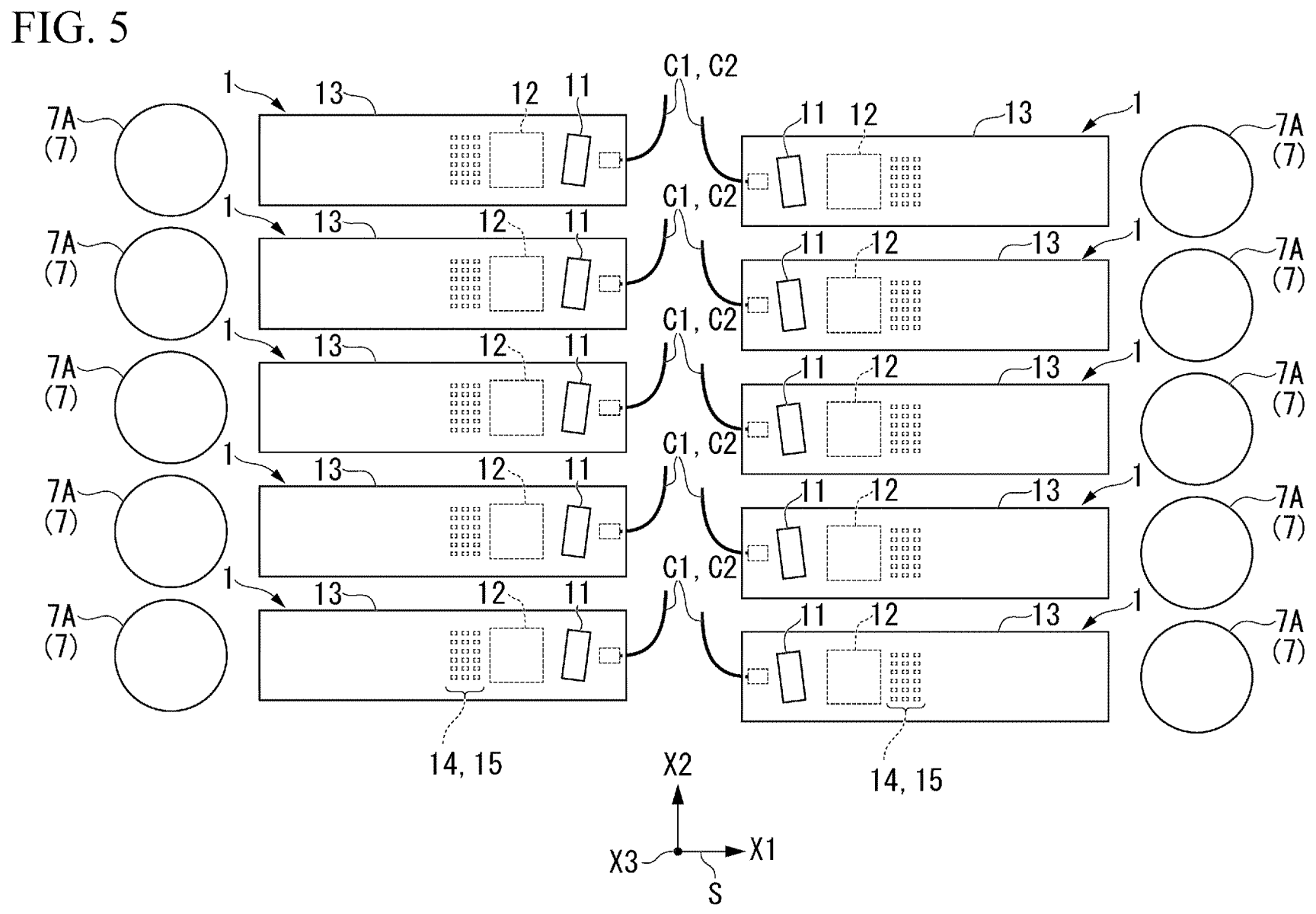
Figure 6:
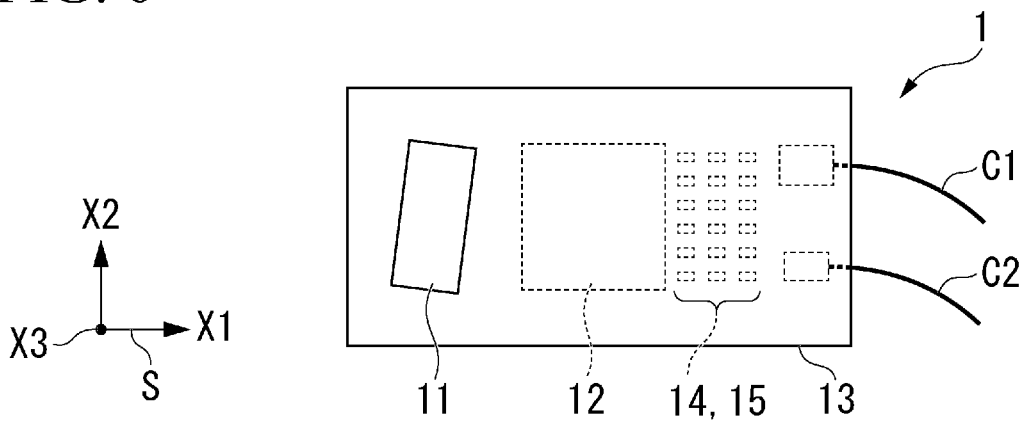
FIG. 6 is a plan view of a modification example 1A of the spatial light modulation unit according to the first embodiment.
Figure 7:
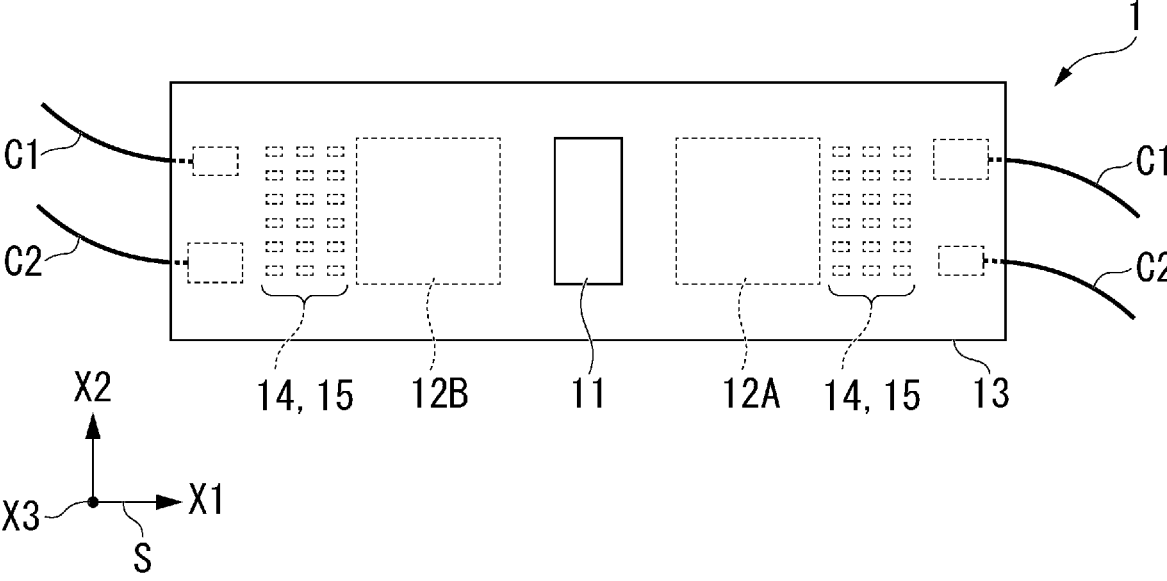
FIG. 7 is a plan view of a modification example 1B of the spatial light modulation unit according to the first embodiment.
Figure 8:
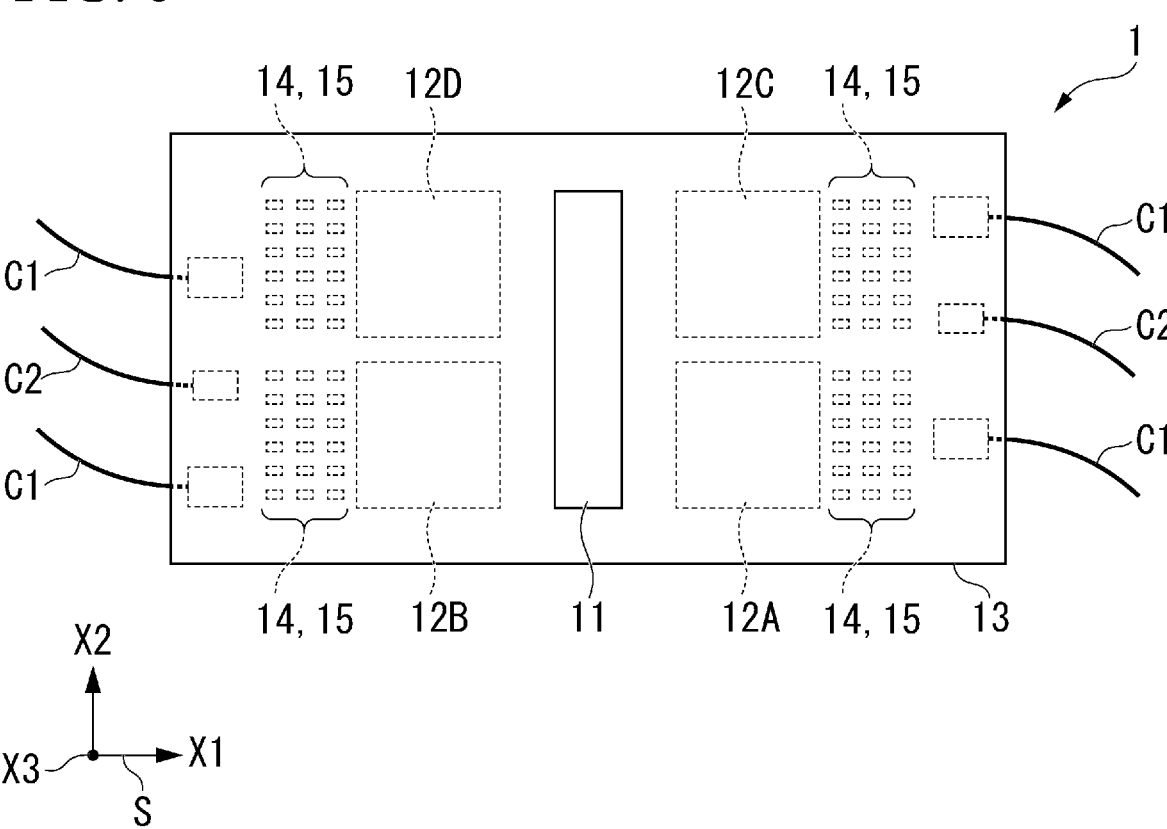
FIG. 8 is a plan view of a modification example 1C of the spatial light modulation unit according to the first embodiment.
Figure 16:
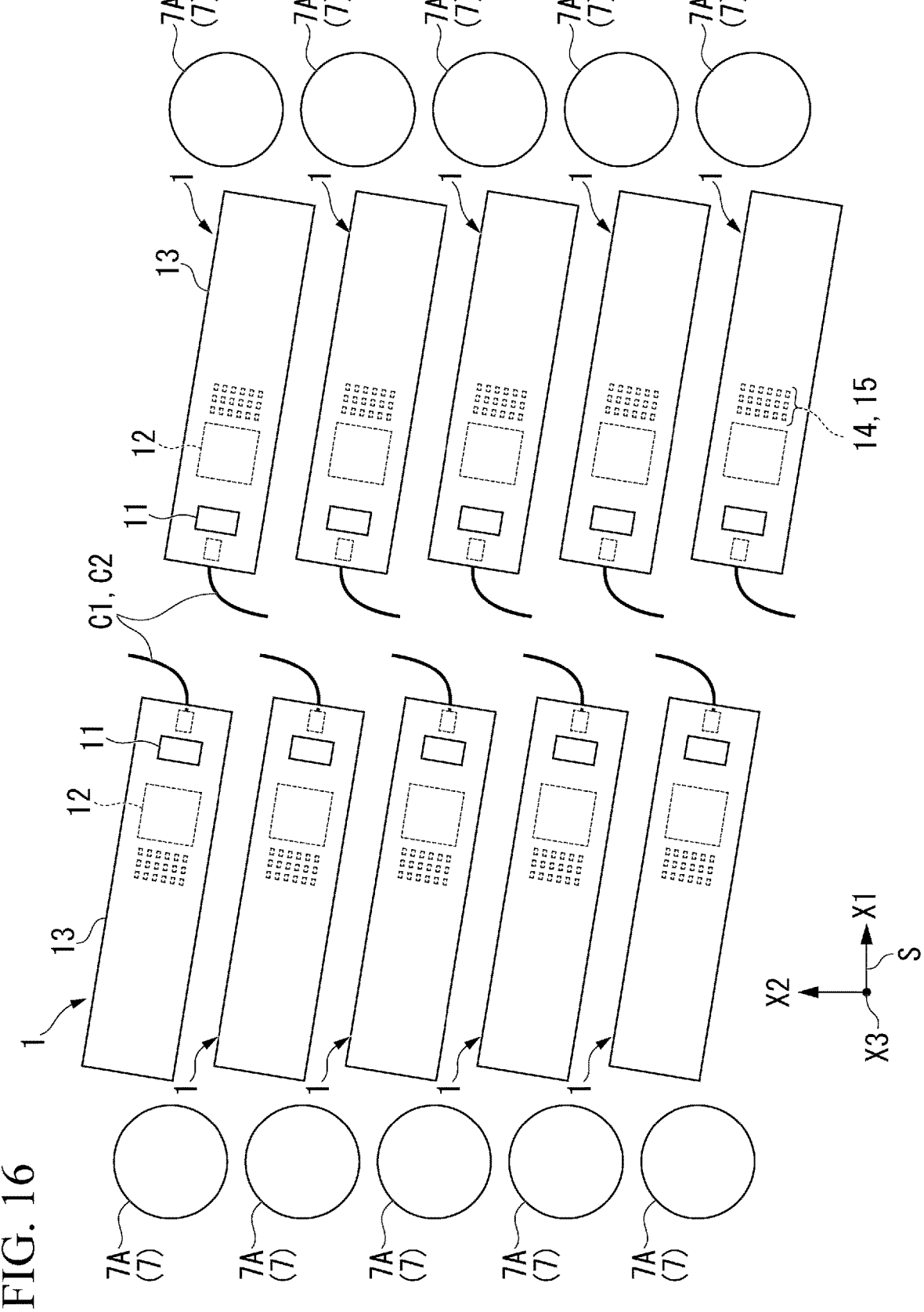
FIG. 16 is a plan view of a modification example of a plurality of aligned spatial light modulation units according to the first embodiment.
Figure 17:
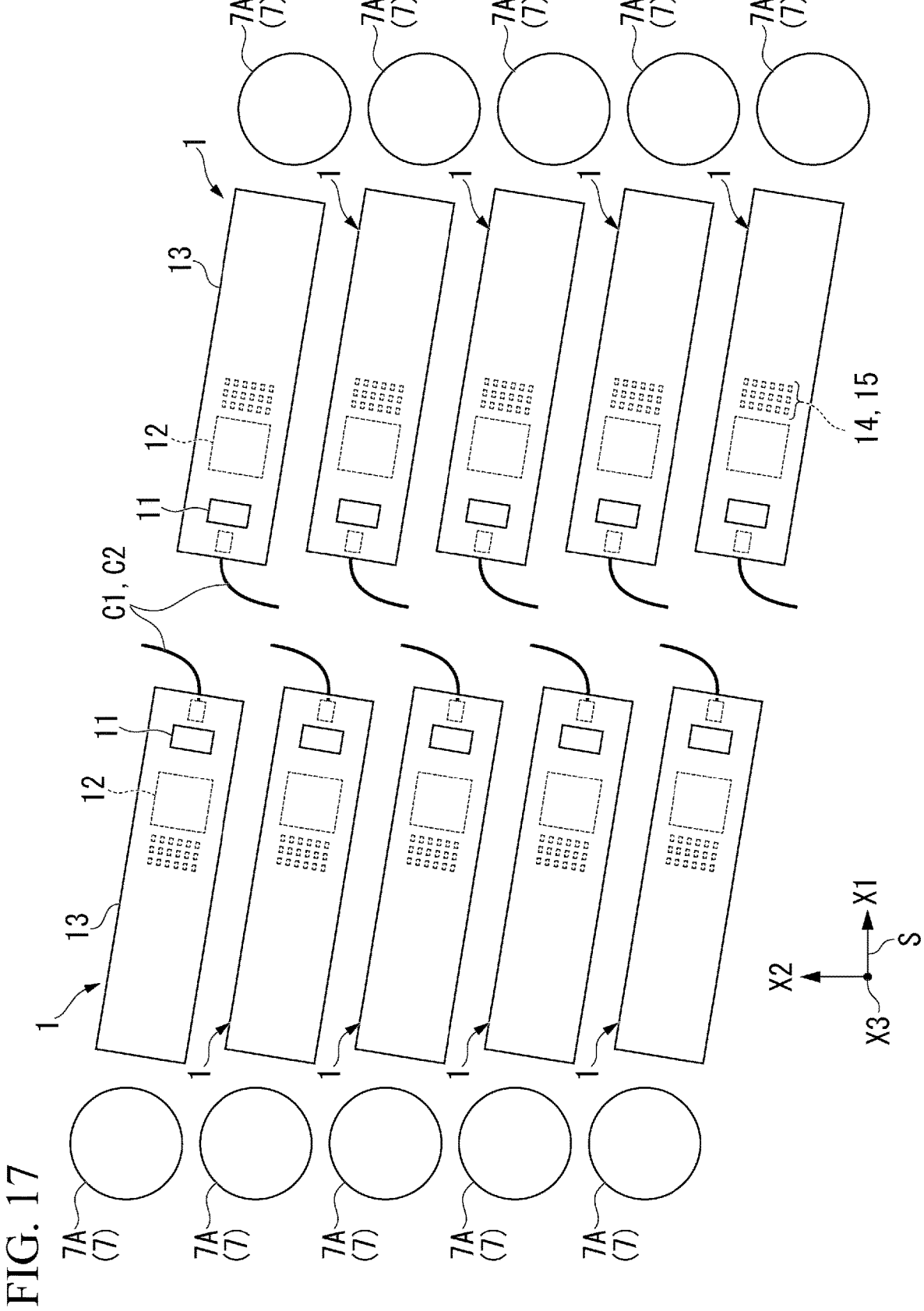
FIG. 17 is a plan view of a modification example of a plurality of aligned spatial light modulation units according to the first embodiment.

FIG. 1 is a perspective view showing an exposure apparatus 100 using a spatial light modulation unit 1 according to a first embodiment. FIG. 3 is a view seen from an arrow A direction in FIG. 2 and is a plan view of the spatial light modulation unit 1 according to the first embodiment. FIG. 4 is a side view of the spatial light modulation unit 1 according to the first embodiment. FIG. 5 is a view seen from the arrow A direction in FIG. 2 and is a plan view of a plurality of aligned spatial light modulation units 1 according to the first embodiment. FIG. 6 is a plan view of a modification example 1A of the spatial light modulation unit 1 according to the first embodiment. FIG. 7 is a plan view of a modification example 1B of the spatial light modulation unit 1 according to the first embodiment. FIG. 8 is a plan view of a modification example 1C of the spatial light modulation unit 1 according to the first embodiment. FIG. 16 and FIG. 17 are plan views of modification examples of a plurality of aligned spatial light modulation units according to the first embodiment.

Hereinafter, a direction in which a photosensitive substrate 10 (or a substrate stage 4 moving together with the photosensitive substrate 10) moves relative to the spatial light modulation unit 1 at the time of exposure to the photosensitive substrate 10 is referred to as a scan direction S or a first direction X1. A direction that crosses with (or is orthogonal to) the first direction along a photosensitive surface 10a of the photosensitive substrate 10 is referred to as a second direction X2. A direction that crosses with (or is orthogonal to) the first direction X1 and the second direction X2 is referred to as a third direction X3.

As shown in FIG. 1, the exposure apparatus 100 is an apparatus that illuminates the photosensitive substrate 10 with illumination light via an exposure unit 20 including the spatial light modulation unit 1.

Figure 2:
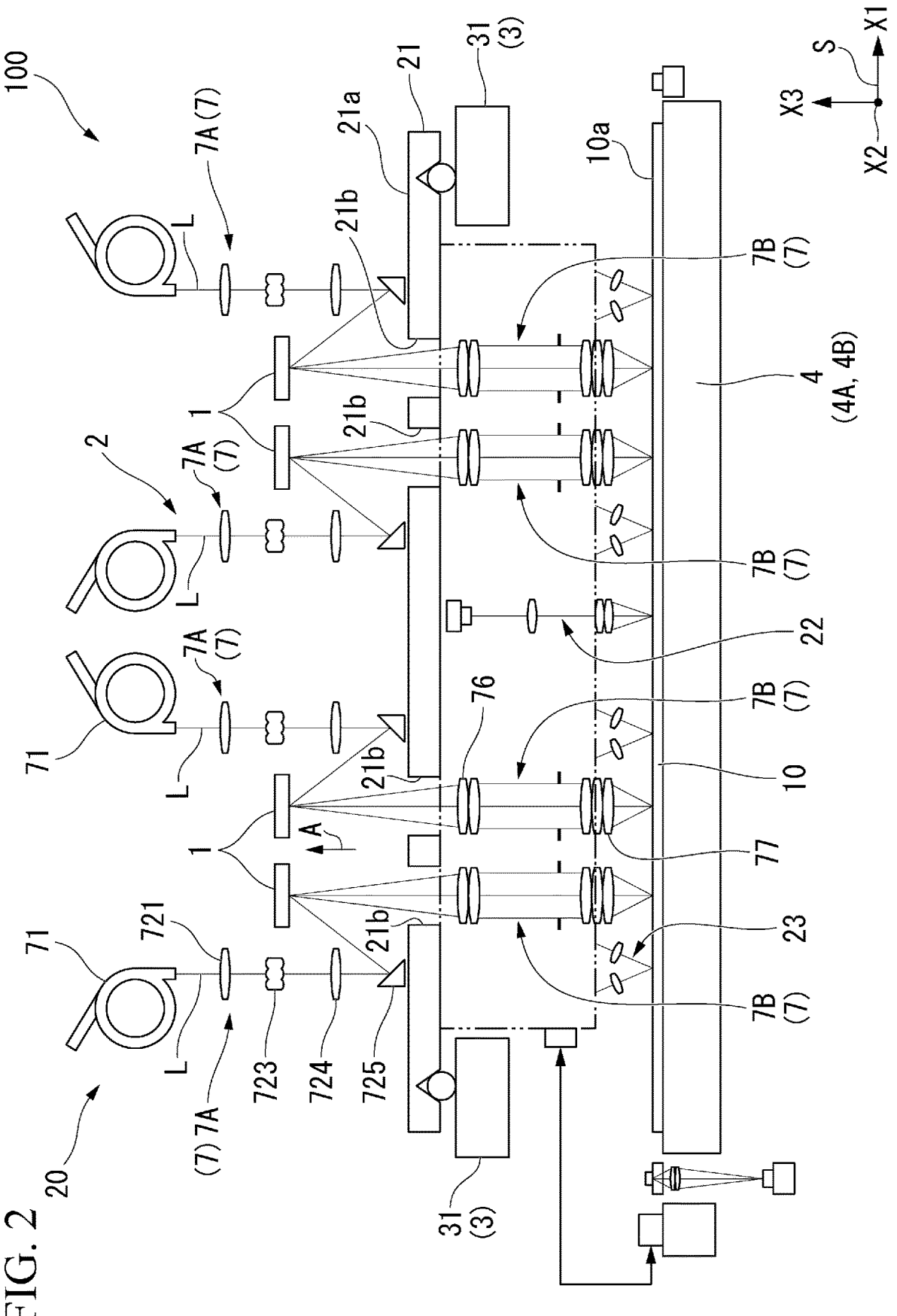
FIG. 2 is a side view showing a schematic of the exposure apparatus.
Figures 3, 4:
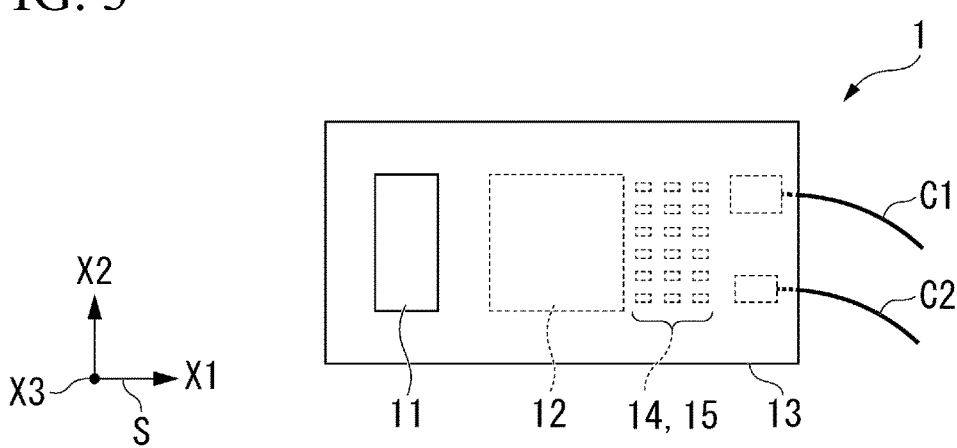
FIG. 3 is a plan view showing a spatial light modulation unit.
FIG. 4 is a side view of the spatial light modulation unit according to the first embodiment.

As shown in FIG. 2, the exposure apparatus 100 cause light modulated by the spatial light modulation unit 1 to pass through an illumination projection module 7 as a projection optical system and performs an exposure by focusing an image by the light on a photosensitive material (also referred to as a resist) that is present on the photosensitive surface 10a of the photosensitive substrate 10.

The exposure apparatus 100 exposes an exposure pattern onto the photosensitive substrate 10 while moving the photosensitive substrate 10 in a scan direction. The spatial light modulation unit 1 is used in such an exposure apparatus 100.

As shown in FIG. 1, the exposure apparatus 100 includes the substrate stage 4 that supports the photosensitive substrate 10 and an exposure apparatus main body 2 that performs a scanning exposure for exposing a predetermined exposure pattern to the photosensitive substrate 10.

(Photosensitive Substrate)

The photosensitive substrate 10 has, for example, a rectangular shape in a plan view. The photosensitive substrate 10 includes a photosensitive material applied to a front layer facing the spatial light modulation unit 1 on the photosensitive surface 10a. The photosensitive substrate 10 is, for example, a glass substrate for a display.

(Substrate Stage)

The substrate stage 4 performs precise positioning of the photosensitive substrate 10 with respect to an image of an exposure pattern projected via the illumination projection module 7. As shown in FIG. 1, the substrate stage 4 performs driving in six-degree-of-freedom directions which are the first direction X1, the second direction X2, the third direction X3, and θX1, θX2, and θX3 directions rotating around the axes X1, X2, and X3.

The substrate stage 4 holds the photosensitive substrate 10 in a state where the photosensitive substrate 10 is placed on an upper surface 4a.

(Exposure Apparatus Main Body)

The exposure apparatus main body 2 includes an exposure unit 20, an optical surface plate 21, an alignment system 22, and an autofocus system 23.

The optical surface plate 21 is formed in a flat plate shape and is fixed to an upper portion of a column 3 that has a gate shape and is provided so as to straddle a base plate B on which the substrate stage 4 is provided and which extends in the first direction X1.

The optical surface plate 21 is arranged at the middle in the first direction X1 of the base plate B.

The base plate B is provided on a floor surface via a plurality of vibration isolation tables BB. The base plate B is a base that extends in the first direction X1, and the substrate stage 4 described later is provided on an upper surface Ba. A guide (not shown) that guides the substrate stage 4 along the first direction X1 is provided on the upper surface Ba of the base plate B.

The column 3 includes a pair of transverse members 31 that extend in the second direction X2 and leg portions 32 that extend downward from both ends of the transverse members 31 and are connected to the base plate B. Since the load of the optical surface plate 21 is applied to the leg portion 32, a vibration isolation table (not shown) may be arranged on a connection portion between the base plate B and the leg portion 32. Three V-grooves are formed at appropriate positions on a lower surface of the optical surface plate 21 or an upper surface of the transverse member 31. The optical surface plate 21 is placed on the pair of transverse members 31 in a state where the upper surface 21a is horizontal via a rotatable ball fitted to each of the three V-grooves.

The illumination projection module 7, the alignment system 22, and the autofocus system 23 are provided on the optical surface plate 21. In order to guide exposure light to the photosensitive surface 10a of the photosensitive substrate 10, a plurality of first penetration holes 21b that penetrate in a thickness direction is provided in the optical surface plate 21.

(Exposure Unit)

The exposure unit 20 causes light supplied from a light source 61 of a light source unit 6 to enter the spatial light modulation unit 1 and irradiates the photosensitive substrate 10 with light of a preset exposure pattern.

The exposure unit 20 includes: the spatial light modulation unit 1; and the illumination projection module 7 for illuminating the spatial light modulation unit 1 with light from the light source 61 of the light source unit 6 and exposing a pattern on the spatial light modulation unit 1 onto the photosensitive substrate 10.

(Light Source Unit)

As the light source unit 6, for example, a light source unit in which a laser having high coherency is the light source 61, a light source unit using a light source 61 such as a semiconductor-laser-type UV-LD, or a light source unit using a lens-relay-type retarder can be employed. The light source 61 may be, for example, a lamp or a laser diode that emits light having a wavelength of 405 nm or 365 nm.

(Illumination Projection Module)

The illumination projection module 7 is provided on the optical surface plate 21. As shown in FIG. 2, the illumination projection module 7 includes an illumination module (illumination optical system) 7A and a projection module (projection optical system) 7B. The illumination module 7A illuminates a spatial light modulator 11 (for example, refer to FIG. 3) of the spatial light modulation unit 1. The projection module 7B illuminates the photosensitive substrate 10 with light reflected by a mirror of the spatial light modulator 11. A plane including an optical axis of illumination light that illuminates the spatial light modulator 11 and an optical axis of the projection module 7B is provided in parallel with the scan direction S.

(Illumination Module 7A)

The illumination module 7A causes laser light L (hereinafter, may be simply referred to as light L) output from the light source 61 of the light source unit 6 shown in FIG. 1 to enter the spatial light modulation unit 1. As shown in FIG. 2, the illumination module 7A includes an optical fiber 71, a collimator lens 721, a fly eye lens 723, a main condenser lens 724, and a mirror 725.

The illumination modules 7A are in one-to-one relationship with the projection modules 7B, and the quantity of illumination modules 7A is equal to the quantity of the projection modules 7B. As shown in FIG. 2, the illumination module 7A captures the laser light L emitted from the optical fiber 71 and illuminates the spatial light modulation unit 1 substantially uniformly with the laser light L that has passed through the collimator lens 721, the fly eye lens 723, and the main condenser lens 724.

As the optical fiber 71, for example, a quartz fiber is used. The laser light L output from the light source 61 is guided by the optical fiber 71 and enters the collimator lens 721. The collimator lens 721 converts the light that emits from the optical fiber 71 and spreads into parallel light and emits the parallel light. The intensity (power) of the light emitted from the optical fiber 71 is appropriately adjusted by a movable ND filter (not shown). The movable filter is a filter having a transmission distribution, and by changing a region through which light passes, the intensity of the light after passing through the filter can be changed. The light that has passed through the collimator lens 721 passes through the fly eye lens 723 and the main condenser lens 724, is reflected by the mirror 725, and enters the spatial light modulation unit 1 at a predetermined reflection angle. Both the illumination module 7A and the light source unit 6 are also regarded to illuminate the spatial light modulation unit 1 and may be collectively represented as an illumination system.

(Projection Module 7B)

As shown in FIG. 2, the projection module 7B is supported by the optical surface plate 21 and is arranged between the spatial light modulation unit 1 and the photosensitive substrate 10. The projection module 7B performs projection, exposure, and formation of an image of a pattern on the spatial light modulation unit 1 onto the photosensitive substrate 10. The projection module 7B is constituted of several lenses. The projection module 7B includes: a magnification adjustment unit that adjusts the magnification for appropriately reducing one pixel of the spatial light modulation unit 1 to a predetermined size and projecting the pixel; and a focus adjustment unit that adjusts a focus by driving the lens in the third direction X3.

A plurality of rows of the projection modules 7B are provided along the first direction X1 in the optical surface plate 21.

(Spatial Light Modulation Unit 1)

The spatial light modulation unit 1 modulates the illumination light and produces an exposure pattern. The spatial light modulation unit 1 includes an OFF light absorption plate (not shown). As an example, a digital mirror device is employed as the spatial light modulation unit 1. The spatial light modulation unit 1 includes a plurality of elements (mirrors in the digital mirror device). Each of the plurality of elements that constitute the spatial light modulation unit 1 can be controlled individually and periodically. Therefore, it is preferable that the light source 61 emit pulse light having a certain period based on a period at which the element is individually controlled or emit pulsed light only for a predetermined period of time instead of emitting continuous light.

It is preferable that the spatial light modulation unit 1 is held by a SLM stage capable of being driven in six-degree-of-freedom directions which are the first direction X1, the second direction X2, the third direction X3, and θX1, θX2, and θX3 directions rotating around the axes X1, X2, and X3. The position and the attitude of the spatial light modulation unit 1 is corrected by the driving of the SLM stage, for example, by the amount of deviation of the substrate stage 4 from a target value. The exposure unit 20 including the SLM stage is supported by the optical surface plate 21.

First Embodiment

The spatial light modulation unit 1 according to the first embodiment is described.

FIG. 3 is a view seen from the arrow A direction in FIG. 2 and is a plan view of the spatial light modulation unit 1 according to the first embodiment. FIG. 4 is a side view of the spatial light modulation unit 1 according to the first embodiment. FIG. 5 is a view seen from the arrow A direction in FIG. 2 and is a plan view of the plurality of aligned spatial light modulation units 1 according to the first embodiment.

The spatial light modulation unit 1 according to the first embodiment is used in the exposure apparatus 100 that exposes an exposure pattern onto the photosensitive substrate 10 while moving the photosensitive substrate 10 in the scan direction S.

The spatial light modulation unit 1 according to the first embodiment is supported by the optical surface plate 21.

In detail, as shown in FIG. 5, a plurality of spatial light modulation units 1 are aligned in a state where a plane faces the photosensitive substrate 10.

As shown in FIG. 3 to FIG. 5, the spatial light modulation unit 1 includes: the spatial light modulator 11 having a plurality of elements (not shown); a controller 12 that controls the plurality of elements (spatial light modulator 11) in accordance with an exposure pattern; and a SLM substrate 13 on which the spatial light modulator 11 and the controller 12 are provided.

Here, the controller 12 is arranged side by side in the scan direction S with respect to the spatial light modulator 11. In this way, the controller 12 is provided on the SLM substrate 13. Accordingly, a data communication speed can be improved compared to the case in which the controller that controls the spatial light modulator is provided on a separate substrate that is separated from the substrate on which the spatial light modulator is provided via a wiring, a connector, and the like. Therefore, the number of pixels of the spatial light modulator 11 can be increased, and/or an update speed can be enhanced. Further, the controller 12 is arranged side by side in the scan direction S with respect to the spatial light modulator 11. Therefore, spacing between the spatial light modulators 11 adjacent to each other in the second direction X2 that crosses with the scan direction S can be shortened. Accordingly, the spatial light modulator 11 can be densely arranged in the second direction X2 that crosses with the scan direction S. Therefore, an exposure area of an exposure pattern exposed in a single scan can be increased, and the throughput can be enhanced. Further, by enhancing the update rate of the spatial light modulator 11, movement speed in the scan direction S of the substrate stage 4 can be accelerated. As a result, exposure time per sheet of the photosensitive substrate 10 is shortened, and throughput can be enhanced.

The spatial light modulator 11 has a rectangular shape or a square shape in a plan view. Further, a longitudinal direction (a direction in parallel with a side that constitutes the rectangular shape or the square shape) of the spatial light modulator 11 may be along the scan direction S or may be along the second direction X2 that crosses with the scan direction S. The spatial light modulator 11 is provided on a front side surface 13a of the SLM substrate 13 as shown in FIG. 4. The spatial light modulator 11 is exposed to face the photosensitive substrate 10 (or the substrate stage 4).

The controller 12 controls the plurality of elements of the spatial light modulator 11 in accordance with the exposure pattern. The controller 12 may be, for example, a PLD (programmable logic device) such as a FPGA (field-programmable gate array). As shown in FIG. 4, the controller 12 is provided on a rear side surface 13b of the SLM substrate 13. The controller 12 is exposed to a space on the rear side surface 13b side of the SLM substrate 13.

The SLM substrate 13 has a rectangular shape in a plan view. Further, a longitudinal direction (direction in parallel with a longer side of the rectangular shape) of the SLM substrate 13 is along the scan direction S.

In this way, the longitudinal direction of the spatial light modulator 11 is along the second direction X2 that crosses with the scan direction S, and the longitudinal direction of the SLM substrate 13 is along the scan direction S. Thereby, the plurality of elements (not shown) included in the spatial light modulator 11 can be densely arranged in the second direction X2, and the SLM substrate 13 can be densely arranged in the second direction X2. Therefore, a throughput which is the amount of information of the exposure pattern exposed in a single scan can be increased.

The spatial light modulation unit 1 includes an electric source circuit 14 connected to an electric source cable C1 connected to an outside portion of the SLM substrate 13 and a communication circuit 15 connected to a data communication cable C2 connected to an outside portion of the SLM substrate 13. Here, the electric source circuit 14 and the communication circuit 15 are aligned along the scan direction S with respect to the spatial light modulator 11 and the controller 12. Thereby, it is possible to improve a data communication speed and an electric source efficiency, and it is possible to decrease the spacing between the spatial light modulators 11 adjacent to each other in the second direction X2 and the size in the second direction X2 of the SLM substrate 13 compared to the case in which the electric source circuit and the communication circuit 15 are provided on a separate substrate separate from the SLM substrate 13.

As shown in FIG. 4, the spatial light modulation unit 1 may include a heat sink 16. The heat sink 16 is not arranged on the front side surface 13a of the SLM substrate 13 but is arranged on the rear side surface 13b of the SLM substrate 13.

The spatial light modulator 11 is provided on the front side surface 13a of the SLM substrate 13, and the controller 12 is provided on the rear side surface 13b of the SLM substrate 13. For a functional reason, the spatial light modulator 11 is provided on the front side surface 13a in a state of facing the photosensitive substrate 10.

Here, the heat sink 16 is preferably in contact with the controller 12. Thereby, since the controller 12 can be cooled from the rear side surface 13b of the SLM substrate 13, it is possible to efficiently prevent the temperature increase of the spatial light modulation unit 1 due to heat generation from the controller 12 and prevent an impact on the exposure performance.

The heat sink 16 is formed of a material having high thermal conductivity such as, for example, a metal material.

The heat sink 16 may include a flow passage 16T through which a fluid refrigerant such as water passes. The flow passage 16T is in communication with one end of a cooling pipe 16P at the outside of the heat sink 16. Another end of the cooling pipe 16P is in communication with a refrigerant pump (not shown). Thereby, it is possible to effectively improve the cooling performance of the spatial light modulator 11 or the controller 12 by the heat sink 16.

Here, the spatial light modulator 11 is preferably arranged on a further upstream side of the flow passage 16T than the controller 12. Thereby, it is possible to effectively prevent the temperature increase of the spatial light modulator 11 that has a relatively large effect on the exposure performance.

The SLM substrate 13 may include a Peltier element 17 that is arranged on the rear side surface 13b of the SLM substrate 13 and is in contact with the heat sink 16. Further, the SLM substrate 13 may include an intermediate portion (not shown) that is in contact with the spatial light modulator 11 and the Peltier element 17. The Peltier element 17 is preferably in contact with the spatial light modulator 11 via the intermediate portion. That is, the spatial light modulator 11 may be in direct contact with the Peltier element 17 or may be in contact with the Peltier element 17 via the intermediate portion made of a metal such as copper, aluminum, or the like. Thereby, even if the spatial light modulator 11 is provided on the front side surface 13a of the SLM substrate 13, the spatial light modulator 11 can be cooled from the rear side surface 13b of the SLM substrate 13. Therefore, both of the cooling of the spatial light modulator 11 and the cooling of the controller 12 can be achieved.

As shown in FIG. 16, the spatial light modulator 11, the controller 12, the electric source circuit 14, and the communication circuit 15 may be arranged to be aligned in a longitudinal direction of the SLM substrate 13, the longitudinal direction of the SLM substrate 13 may be arranged to be tilted relative to the scan direction, and the spatial light modulator 11 and the illumination module 7A may be arranged side by side in the scan direction. When the digital mirror device (DMD) is used as the spatial light modulator 11, a mirror in an ON state of the DMD may be tilted to the scan direction. As shown in FIG. 17, the spatial light modulator 11, the controller 12, the electric source circuit 14, the communication circuit 15, and the illumination module 7A may be arranged to be aligned in the longitudinal direction of the SLM substrate 13, and the longitudinal direction of the SLM substrate 13 may be arranged to be tilted relative to the scan direction. When the digital mirror device (DMD) is used as the spatial light modulator 11, the mirror in an ON state of the DMD may be tilted to the scan direction.

Modification Example 1A

Next, a modification example 1A of the spatial light modulation unit 1 according to the first embodiment is described. Descriptions with respect to matters common to the spatial light modulation unit 1 according to the first embodiment may be omitted.

FIG. 6 is a plan view of the modification example 1A of the spatial light modulation unit 1 according to the first embodiment.

As shown in FIG. 6, the controller 12 is arranged side by side in the scan direction S with respect to the spatial light modulator 11.

Here, the modification example 1A of the spatial light modulation unit 1 according to the first embodiment includes a spatial light modulator 11 arranged to be tilted slightly (for example, at 5 degrees) with reference to the scan direction S unlike the spatial light modulation unit 1 according to the first embodiment shown in FIG. 5. That is, while the longitudinal direction of the photosensitive substrate 10 is parallel to a shorter direction of the spatial light modulator 11 in the spatial light modulation unit 1 according to the first embodiment, a longitudinal direction of the photosensitive substrate is not parallel to a shorter direction of the spatial light modulator 11. Thereby, even if the entire SLM substrate 13 is not obliquely arranged, the width and the position of the exposure pattern can be set at a finer unit than one element (one mirror) in the plurality of elements.

Further, the spatial light modulator 11 may be provided on the SLM substrate 13 such that an array direction in which the plurality of elements are arrayed is along a direction that crosses with the scan direction S.

Further, the spatial light modulator 11 may be provided on the SLM substrate 13 such that the array direction in which the plurality of elements are arrayed is along a direction orthogonal to the scan direction S.

Modification Example 1B

Next, a modification example 1B of the spatial light modulation unit 1 according to the first embodiment is described. Descriptions with respect to matters common to the spatial light modulation unit 1 according to the first embodiment may be omitted.

FIG. 7 is a plan view of the modification example 1B of the spatial light modulation unit 1 according to the first embodiment.

As shown in FIG. 7, the controller 12 is arranged side by side in the scan direction S with respect to the spatial light modulator 11.

Here, the modification example 1B of the spatial light modulation unit 1 according to the first embodiment includes a controller 12 having a first controller 12A arranged on one side in the scan direction S of the spatial light modulator 11 and a second controller 12B arranged on another side unlike the spatial light modulation unit 1 according to the first embodiment shown in FIG. 5. That is, the controller 12 that controls the plurality of elements of the spatial light modulator 11 is provided on both sides in the scan direction S of the spatial light modulator 11. In this way, since the controller 12 is provided on both sides in the scan direction S of the spatial light modulator 11, even when a plurality of controllers 12 are provided on a single SLM substrate 13 to order to improve the processing speed, the controller 12 can be arranged close to the spatial light modulator 11. Further, the plurality of controllers 12 can be arranged on the single SLM substrate 13 while maintaining a short spacing between the spatial light modulators 11 adjacent to each other in the second direction X2 that crosses with the scan direction S. Therefore, the throughput which is the amount of information of the exposure pattern exposed in a single scan can be increased.

Modification Example 1C

Next, a modification example 1C of the spatial light modulation unit 1 according to the first embodiment is described. Descriptions with respect to matters common to the spatial light modulation unit 1 according to the first embodiment may be omitted.

FIG. 8 is a plan view of the modification example 1C of the spatial light modulation unit 1 according to the first embodiment.

As shown in FIG. 8, the controller 12 is arranged side by side in the scan direction S with respect to the spatial light modulator 11.

Here, the modification example 1C of the spatial light modulation unit 1 according to the first embodiment includes a controller 12 having: a first controller 12A and a third controller 12C that are arranged on one side in the scan direction S of the spatial light modulator 11; and a second controller 12B and a fourth controller 12D that are arranged on another side unlike the spatial light modulation unit 1 according to the first embodiment shown in FIG. 5. That is, the controller 12 includes the first controller 12A arranged on the one side in the scan direction S of the spatial light modulator 11 and the third controller 12C arranged side by side in the second direction X2 that crosses with the scan direction S with respect to the first controller 12A.

In this way, since the controller 12 includes the first controller 12A arranged on the one side in the scan direction S of the spatial light modulator 11 and the third controller 12C arranged side by side in the second direction X2 that crosses with the scan direction 5, even when a plurality of controllers 12 are provided on a single SLM substrate 13 to order to improve the processing speed, the controller 12 can be arranged close to the spatial light modulator 11. Further, still more controllers 12 can be arranged on the single SLM substrate 13 while maintaining a short spacing between the spatial light modulators 11 adjacent to each other in the second direction X2 that crosses with the scan direction S.

Therefore, the throughput which is the amount of information of the exposure pattern exposed in a single scan can be increased.

Second Embodiment

Next, a spatial light modulation unit 1 according to a second embodiment is described.

Figure 9:
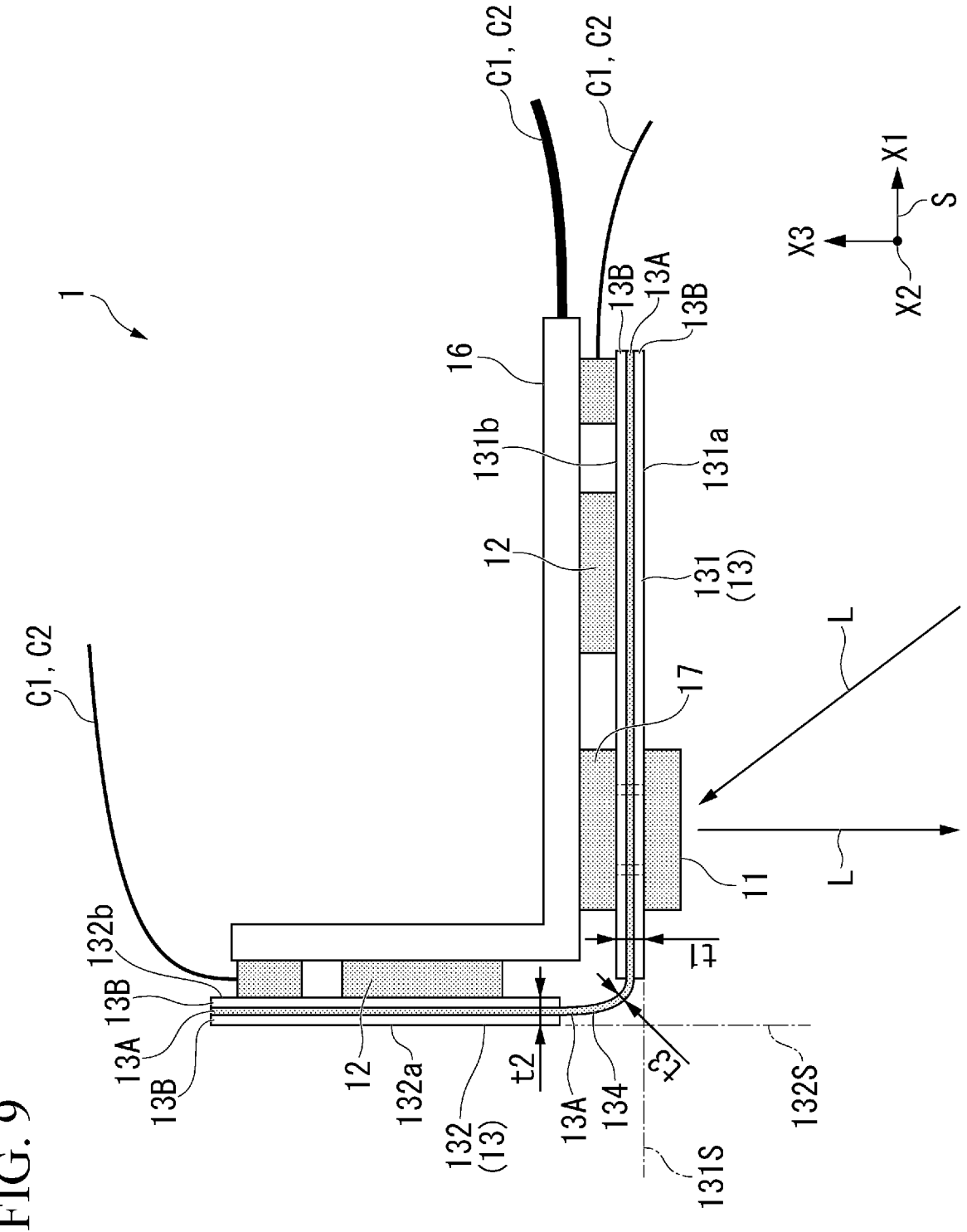
FIG. 9 is a side view of a spatial light modulation unit according to a second embodiment.
Figure 10:
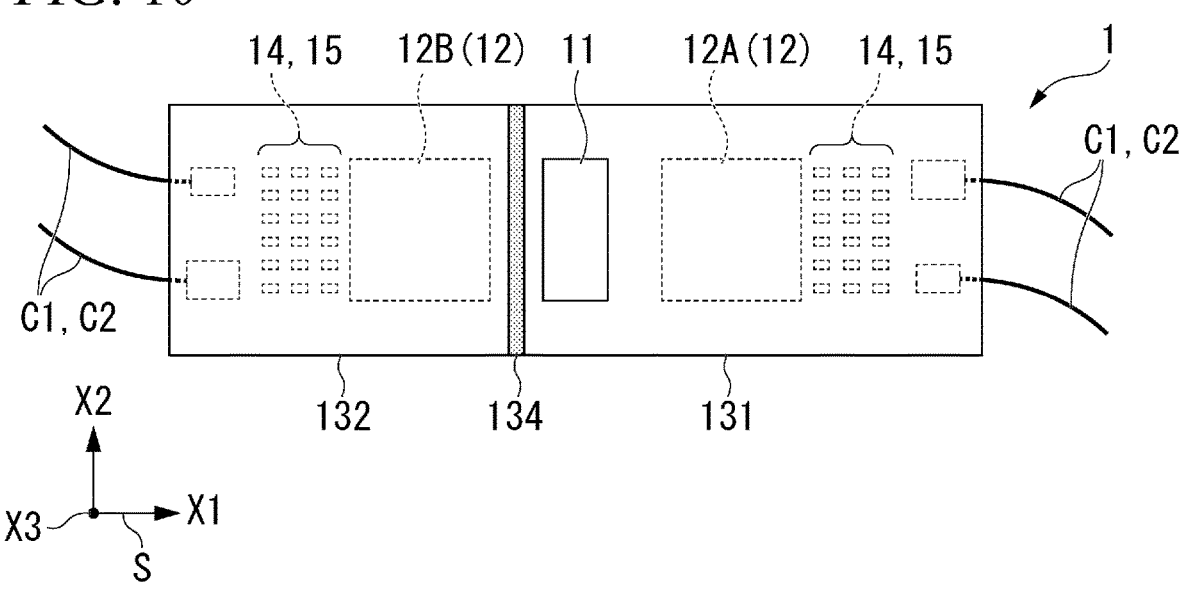
FIG. 10 is an expansion plan view of the spatial light modulation unit according to the second embodiment.
Figure 11:
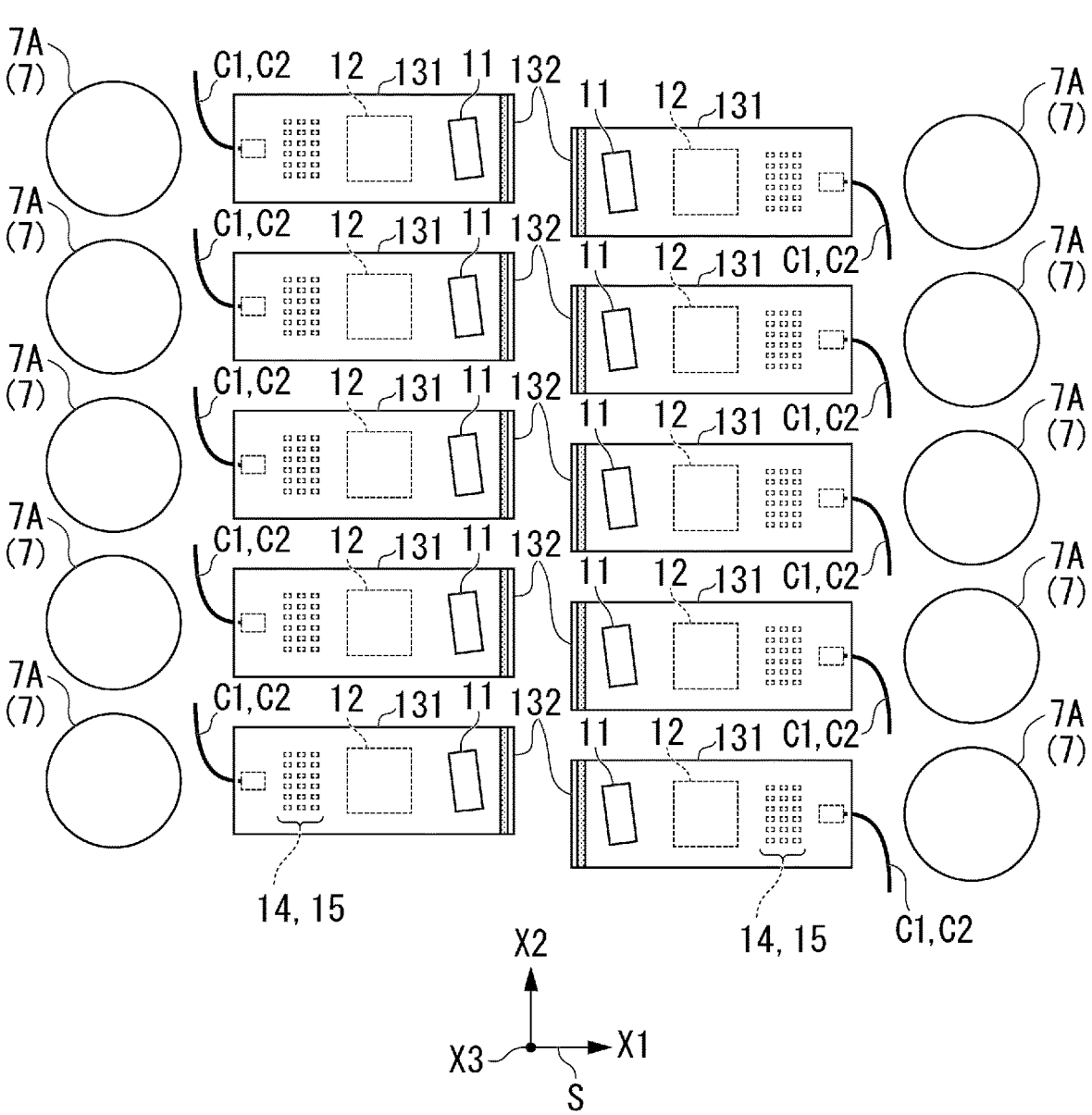
FIG. 11 is a plan view of a plurality of aligned spatial light modulation units according to the second embodiment.
Figure 12:
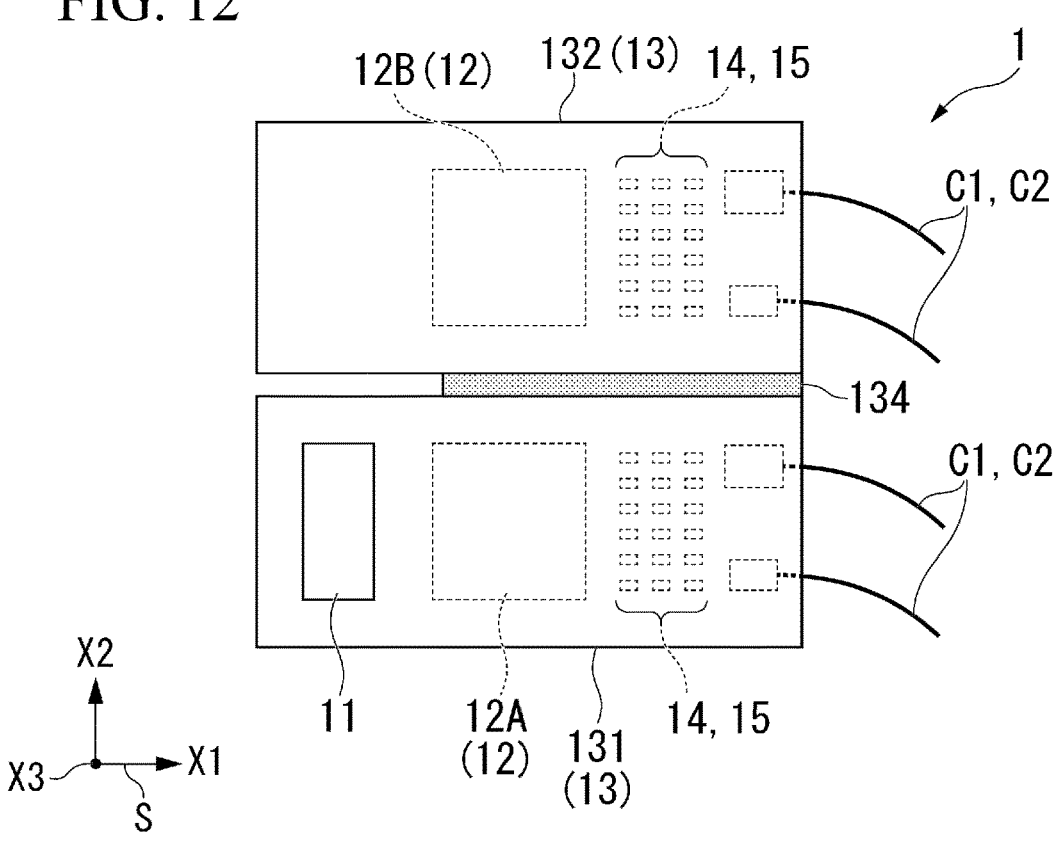
FIG. 12 is an expansion plan view of a modification example 2A of a spatial light modulation unit 1 according to the second embodiment.
Figure 13:
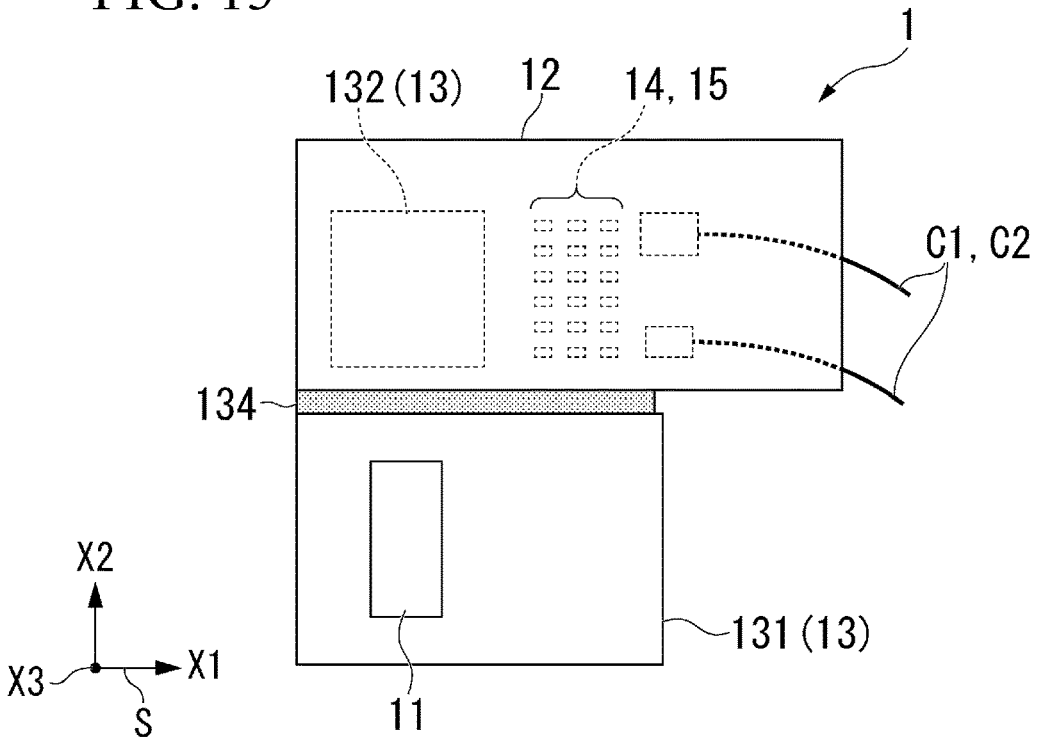
FIG. 13 is an expansion plan view of a modification example 2B of the spatial light modulation unit 1 according to the second embodiment.
Figure 14:
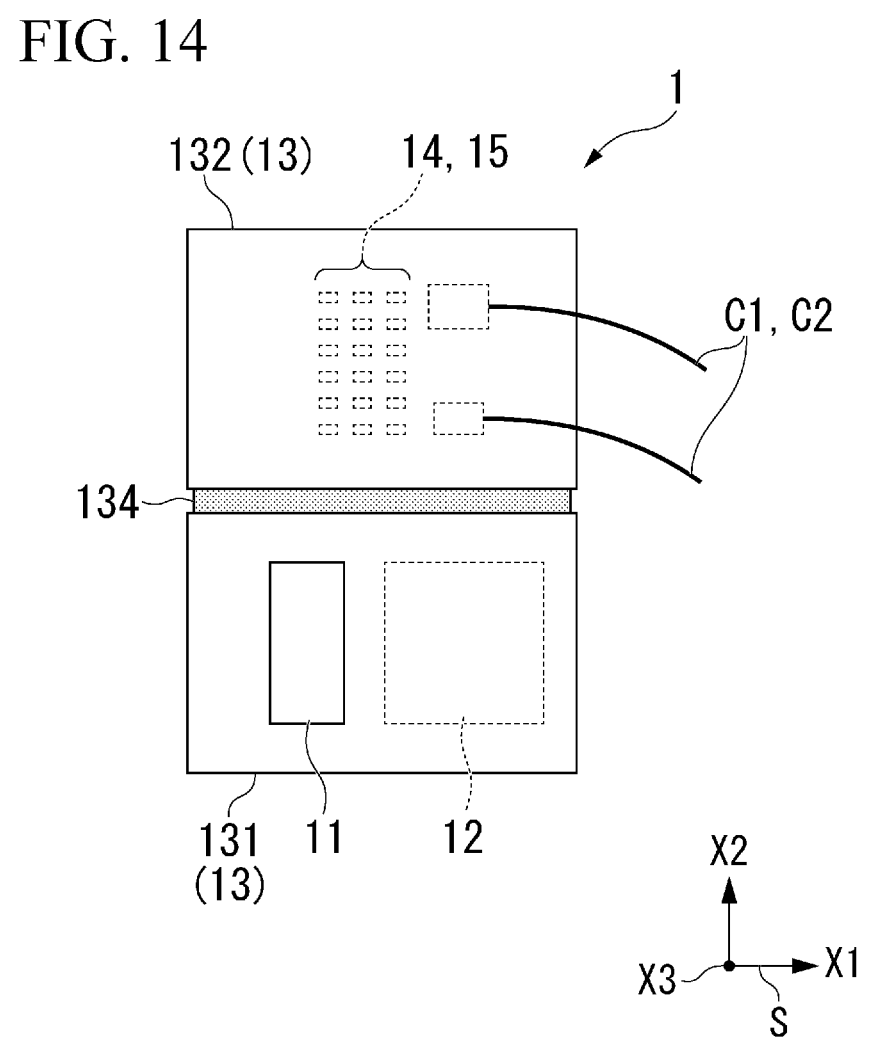

FIG. 9 is a side view of the spatial light modulation unit 1 according to the second embodiment. FIG. 10 is an expansion plan view of the spatial light modulation unit 1 according to the second embodiment. FIG. 11 is a plan view of a plurality of aligned spatial light modulation units 1 according to the second embodiment. FIG. 12 is an expansion plan view of a modification example 2A of the spatial light modulation unit 1 according to the second embodiment. FIG. 13 is an expansion plan view of a modification example 2B of the spatial light modulation unit 1 according to the second embodiment. FIG. 14 is an expansion plan view of a modification example 2C of the spatial light modulation unit 1 according to the second embodiment.

The spatial light modulation unit 1 according to the second embodiment is used in the exposure apparatus 100 that exposes an exposure pattern onto the photosensitive substrate 10 while moving the photosensitive substrate 10 in the scan direction S similarly to the spatial light modulation unit 1 according to the first embodiment.

The spatial light modulation unit 1 according to the second embodiment is supported by the optical surface plate 21 similarly to the spatial light modulation unit 1 according to the first embodiment.

In detail, as shown in FIG. 11, a plurality of spatial light modulation units 1 are aligned in a state where a plane faces the photosensitive substrate 10.

As shown in FIG. 9 to FIG. 14, the spatial light modulation unit 1 includes a spatial light modulator 11 having a plurality of elements (not shown), a controller 12 (a first controller 12A, a second controller 12B) that controls the plurality of elements of the spatial light modulator 11 in accordance with an exposure pattern, a supply portion (not shown) that supplies electric power to the spatial light modulator 11 and the controller 12, and an SLM substrate 13 on which the spatial light modulator 11 and the controller 12 are provided.

Here, the SLM substrate 13 includes: a first substrate 131 on which the spatial light modulator 11 is provided and to which a section of the supply portion is connected; and a second substrate 132 on which the controller 12 is provided and to which another section of the supply portion is connected. As shown in FIG. 9, a second plane 132S on which the controller 12 is provided of the second substrate 132 crosses with a first plane 131S on which the spatial light modulator 11 is provided of the first substrate 131. Thereby, even when both the spatial light modulator 11 and the controller 12 are provided on the SLM substrate 13, the size in the scan direction S can be decreased. Accordingly, the SLM substrate 13 can be densely arranged along the scan direction S. Therefore, the distance in the scan direction S required for a single scan for the illumination of the exposure pattern can be shortened, and a time for a single scan can be shortened.

The front side surface 131a of the first substrate 131 and the front side surface 132a may not have a relationship of being on the same plane. The SLM substrate 13 may be in a state of being bent. According to any of these, it is possible to decrease the size in the scan direction S. Accordingly, the SLM substrate 13 can be densely arranged along the scan direction S.

The first substrate 131 is a substrate on which the spatial light modulator 11 is provided in the SLM substrate 13. The first substrate 131 is arranged to be orthogonal to the third direction X3 such that front side surface 131a faces the photosensitive substrate 10 (or the substrate stage 4 on which the photosensitive substrate 10 is provided) in a state of being appropriately supported by the optical surface plate 21 via a SLM stage described later.

The second substrate 132 is a substrate on which the spatial light modulator 11 is not provided in the SLM substrate 13. That is, the spatial light modulator 11 is provided on the first substrate 131, and the spatial light modulator 11 is not provided on the second substrate 132.

The second substrate 132 is arranged such that the front side surface 132a crosses with the first direction and the second direction in a state of being appropriately supported by the optical surface plate 21 via the SLM stage (refer to FIG. 15) described later.

The second plane 132S is preferably perpendicular to the scan direction S (first direction X1). That is, the front side surface 132a of the second substrate 132 is preferably orthogonal to the scan direction S (first direction X1). Thereby, it is possible to decrease the size in the scan direction S of the SLM substrate 13, and a space above the rear side surface 131b of the first substrate 131 can be used, for example, for the arrangement of the SLM stage or the like.

The controller 12 (second controller 12B) is provided on the second substrate 132. The controller 12 is provided on the rear side surface 132b of the second substrate 132. Thereby, the controller 12 can be arranged at a position where the controller 12 is easily in contact with the heat sink 16.

As shown in FIG. 9, the heat sink 16 is formed in a plate shape having a L shape in a cross-section along the first substrate 131 and the second substrate 132 in a side view.

The SLM substrate 13 includes a bend portion 134 that is bent and connects between the first substrate 131 and the second substrate 132. The bend portion 134 has a third plate thickness t3 that is thinner than a first plate thickness t1 of the first substrate 131 and a second plate thickness t2 of the second substrate 132. Thereby, the bending stiffness (cross-sectional secondary moment around a weak axis) of the bend portion 134 can be decreased compared to the bending stiffness of each of the first substrate 131 and the second substrate 132. Therefore, the SLM substrate 13 in the spatial light modulation unit 1 in an expanded state as shown in FIG. 10 and FIG. 12 to FIG. 14, that is, the SLM substrate 13 in a state where the front side surface 131a of the first substrate 131 and the front side surface 132a of the second substrate 132 are aligned on the same plane is bent at the bend portion 134, for example, at a right angle, and thereby, the SLM substrate 13 having an L shape in the cross-section as shown in FIG. 9 can be formed.

As shown in FIG. 9, the SLM substrate 13 is formed to include a core layer 13A and a front layer 13B that covers the core layer 13A. The core layer 13A in the bend portion 134 may be exposed. The bend portion 134 may be, for example, a portion in which the front layer is removed and the remaining core material is exposed in the SLM substrate 13 in which the core layer 13A and the front layer such as a resist are laminated. Thereby, since the bending stiffness of the bend portion 134 is relatively small, the SLM substrate 13 having a L shape in the cross-section can be easily formed by bending the SLM substrate 13 in the state where the front side surface 131*a* of the first substrate 131 and the front side surface 132*a* of the second substrate 132 are aligned on the same plane at the bend portion 134.

The SLM substrate 13 may include a third substrate (not shown). That is, the SLM substrate 13 may include the third substrate in addition to the first substrate 131 and the second substrate 132 described above. A third plane that is an extension of a front side surface in the third substrate preferably crosses with at least one of the first plane 131S and the second plane 132S. Further, the third plane that is the extension of the front side surface in the third substrate is preferably orthogonal to at least one of the first plane 131S and the second plane 132S. Thereby, by utilizing a space above the rear side surface 131*b* of the first substrate 131 on which the spatial light modulator 11 is provided, a member including the controller 12 can be densely arranged three-dimensionally.

The spatial light modulation unit 1 includes a heat sink 16. The spatial light modulator 11 is provided on the front side surface 131*a* of the SLM substrate 13. The controller 12 is provided on the rear side surface 132*b* of the SLM substrate 13. Here, the heat sink 16 is in contact with the controller 12. Thereby, even when the SLM substrate 13 has a bent L shape in the cross-section as shown in FIG. 9, the heat sink 16 can be arranged by effectively utilizing a space above the rear side surface 131*b* of the first substrate 131 and in the scan direction S of the rear side surface 132*b* of the second substrate 132.

The SLM substrate 13 includes a Peltier element 17 that is arranged on the rear side surface 131*b* of the SLM substrate 13 and is in contact with the heat sink 16. The spatial light modulator 11 is in contact with the Peltier element 17. Thereby, the spatial light modulator 11 provided on the front side surface 131*a* of the SLM substrate 13 can be cooled by the heat sink 16 that is present on the rear side surface 131*b* of the SLM substrate 13.

Modification Example 2A

Next, a modification example 2A of the spatial light modulation unit 1 according to the second embodiment is described. Descriptions with respect to matters common to the spatial light modulation unit 1 according to the first embodiment or the spatial light modulation unit 1 according to the second embodiment may be omitted.

FIG. 12 is a plan view of the modification example 2A of the spatial light modulation unit 1 according to the second embodiment.

The spatial light modulator 11 and the first controller 12A are provided on the first substrate 131.

The second controller 12B is provided on the second substrate 132.

Here, the modification example 2A of the spatial light modulation unit 1 according to the second embodiment is arranged such that the second substrate 132 crosses with the second direction X2. That is, as shown in FIG. 12, the expanded SLM substrate 13 is in a state (refer to FIG. 9) of being rotated around the first direction X1 about the bend portion 134 and is bent. Thereby, for example, a plurality of controllers 12 can be provided on a single spatial light modulation unit 1 by utilizing a space above the rear side surface 131*b* of the first substrate 131 while reducing an area in a plan view of the first substrate 131.

Modification Example 2B

Next, a modification example 2B of the spatial light modulation unit 1 according to the second embodiment is described. Descriptions with respect to matters common to the spatial light modulation unit 1 according to the first embodiment or the spatial light modulation unit 1 according to the second embodiment may be omitted.

FIG. 13 is a plan view of the modification example 2B of the spatial light modulation unit 1 according to the second embodiment.

The spatial light modulator 11 is provided on the first substrate 131. The controller 12 is not provided on the first substrate 131.

The controller 12 is provided on the second substrate 132.

Here, the modification example 2B of the spatial light modulation unit 1 according to the second embodiment is arranged such that the second substrate 132 crosses with the second direction X2. That is, as shown in FIG. 13, the expanded SLM substrate 13 is in a state (refer to FIG. 9) of being rotated around the first direction X1 about the bend portion 134 and is bent. Thereby, for example, a plurality of controllers 12 can be provided on a single spatial light modulation unit 1 by utilizing a space above the rear side surface 131*b* of the first substrate 131 while reducing the area in plan view of the first substrate 131.

Modification Example 2C

Next, a modification example 2C of the spatial light modulation unit 1 according to the second embodiment is described. Descriptions with respect to matters common to the spatial light modulation unit 1 according to the first embodiment or the spatial light modulation unit 1 according to the second embodiment may be omitted.

FIG. 14 is a plan view of the modification example 2C of the spatial light modulation unit 1 according to the second embodiment.

The spatial light modulator 11 and the controller 12 are provided side by side in the first direction X1 on the first substrate 131.

The controller 12 is not provided on the second substrate 132.

Here, the modification example 2C of the spatial light modulation unit 1 according to the second embodiment is arranged such that the second substrate 132 crosses with the second direction X2. That is, as shown in FIG. 14, the expanded SLM substrate 13 is in a state (refer to FIG. 9) of being rotated around the first direction X1 about the bend portion 134 and is bent. Thereby, for example, a plurality of controllers 12 can be provided on a single spatial light modulation unit 1 by utilizing a space above the rear side surface 131*b* of the first substrate 131 while reducing the area in plan view of the first substrate 131.

Third Embodiment

Next, a spatial light modulation unit 1 according to a third embodiment is described.

Figure 15:
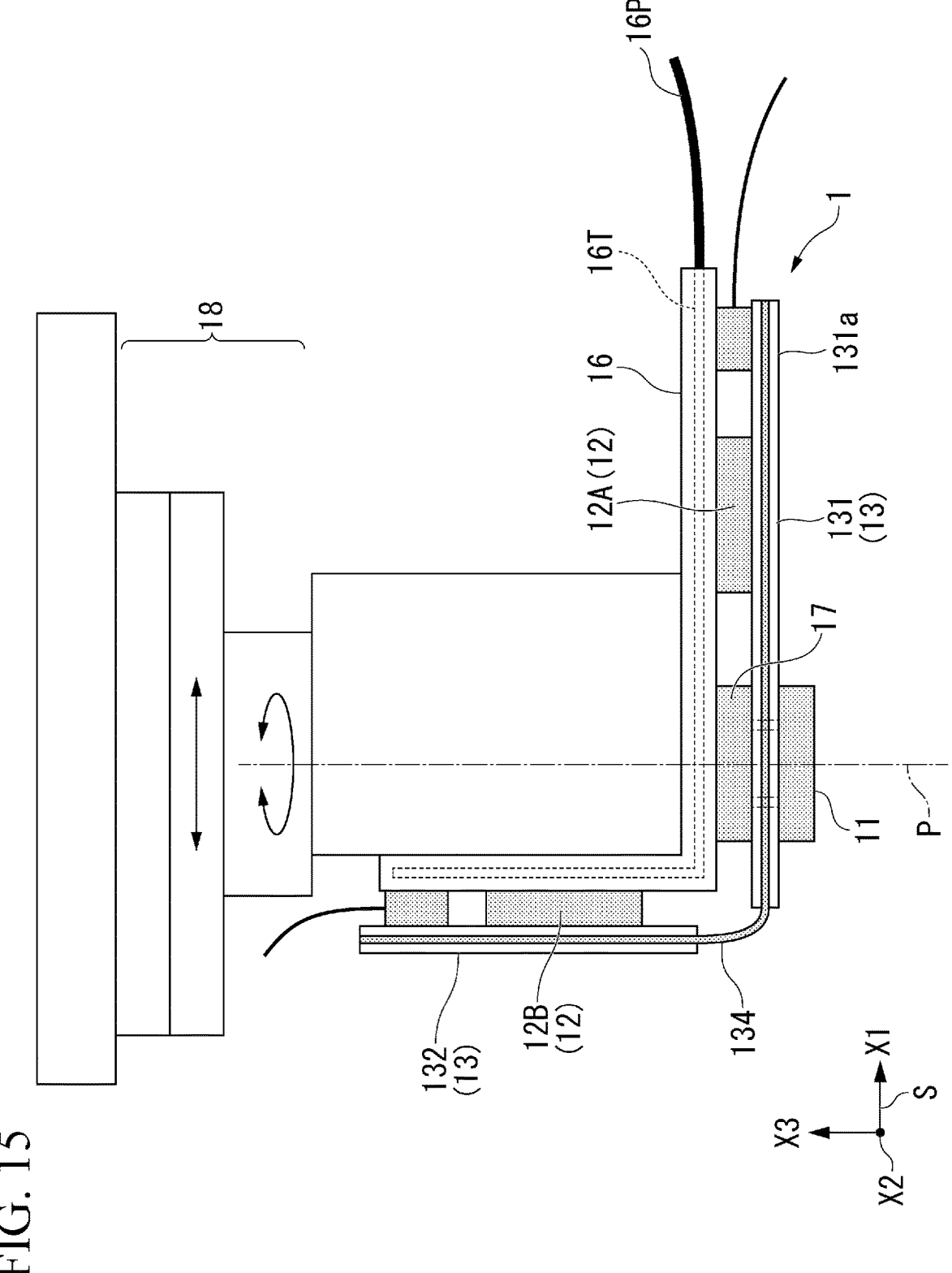
FIG. 15 is a side view of a spatial light modulation unit according to a third embodiment.

FIG. 15 is a side view of the spatial light modulation unit 1 according to the third embodiment.

The spatial light modulation unit 1 according to the third embodiment is used in the exposure apparatus 100 that exposes an exposure pattern onto the photosensitive substrate 10 while moving the photosensitive substrate 10 in the scan direction S similarly to the spatial light modulation unit 1 according to the first embodiment and the spatial light modulation unit 1 according to the second embodiment.

The spatial light modulation unit 1 according to the third embodiment is supported by the optical surface plate 21 similarly to the spatial light modulation unit 1 according to the first embodiment and the spatial light modulation unit 1 according to the second embodiment.

In detail, as shown in FIG. 11, a plurality of spatial light modulation units 1 are aligned in a state where a plane faces the photosensitive substrate 10.

As shown in FIG. 15, the spatial light modulation unit 1 includes a spatial light modulator 11 having a plurality of elements (not shown), a controller 12 that controls the plurality of elements of the spatial light modulator 11 in accordance with an exposure pattern, an SLM substrate 13 on which the spatial light modulator 11 and the controller 12 are provided, and a heat sink 16. The spatial light modulator 11 is provided on a front side surface 131a of the SLM substrate 13. The controller 12 is provided on a rear side surface 131b of the SLM substrate 13.

Here, the heat sink 16 is in contact with the controller 12. Thereby, the heat sink 16 can be arranged by effectively utilizing a space above the rear side surface 131b of the first substrate 131.

The SLM substrate 13 includes a Peltier element 17 that is arranged on the rear side surface 131b of the SLM substrate 13 and is in contact with the heat sink 16. The spatial light modulator 11 is in contact with the Peltier element 17. Thereby, the spatial light modulator 11 provided on the front side surface 131a of the SLM substrate 13 can be cooled by the heat sink 16 that is present on the rear side surface 131b of the SLM substrate 13.

As shown in FIG. 15, the heat sink 16 is supported by a SLM stage 18 that is rotatable around a reference axis P orthogonal to a reflection surface of the spatial light modulator 11. Thereby, the position of the spatial light modulation unit 1 can be corrected.

The heat sink 16 is preferably supported by the SLM stage 18 that is movable in the scan direction S and the second direction X2 that crosses with the scan direction S along the photosensitive surface 10a of the photosensitive substrate 10. Thereby, the position of the spatial light modulation unit 1 in the scan direction S and the second direction X2 that crosses with the scan direction S and can be corrected.

The heat sink 16 is preferably supported by the SLM stage 18 that is movable at six degrees of freedom. Thereby, it is possible to correct the position of the spatial light modulation unit 1 in six-degree-of-freedom directions which are the scan direction S (first direction X1), the second direction X2 that crosses with the scan direction S, the third direction X3 that is orthogonal to the first direction X1 and the second direction X2, and a θX1 direction, a θX2 direction, and a θX3 direction rotating around the first direction XL the second direction X2, and the third direction X3, respectively.

The heat sink 16 may include a flow passage 16T through which a fluid refrigerant such as water passes. The flow passage 16T is in communication with one end of a cooling pipe 16P at the outside of the heat sink 16. Another end of the cooling pipe 16P is in communication with a refrigerant pump (not shown). Thereby, it is possible to effectively improve the cooling performance of the spatial light modulator 11 or the controller 12 by the heat sink 16.

Here, the spatial light modulator 11 is preferably arranged on a further upstream side of the flow passage 16T than the controller 12. Thereby, it is possible to effectively prevent the temperature increase of the spatial light modulator 11 that has a relatively large effect on the exposure performance.

Although the embodiments of the present invention have been described above, a correspondence relationship between the present invention and the above embodiments are supplementally described.

(1) In the embodiment described above, the spatial light modulation unit 1 is used in the exposure apparatus 100 that exposes an exposure pattern onto the photosensitive substrate 10 while moving the photosensitive substrate 10 in the scan direction S. The spatial light modulation unit 1 includes: the spatial light modulator 11 having a plurality of elements; the controller 12 that controls the plurality of elements of the spatial light modulator 11 in accordance with the exposure pattern; and the SLM substrate 13 on which the spatial light modulator 11 and the controller 12 are provided. The controller 12 is arranged side by side in the scan direction S with respect to the spatial light modulator 11.

In the spatial light modulation unit 1 having such a configuration, the controller 12 is provided on the SLM substrate 13. Accordingly, a data communication speed can be improved compared to the case in which the controller that controls the spatial light modulator is provided on a separate substrate that is separated from the substrate on which the spatial light modulator is provided via a wiring, a connector, and the like. Therefore, the number of pixels of the spatial light modulator 11 can be increased, and an update speed can be enhanced. Further, the controller 12 is arranged side by side in the scan direction S with respect to the spatial light modulator 11. Therefore, the spacing between the spatial light modulators 11 adjacent to each other in the second direction X2 that crosses with the scan direction S can be shortened. Accordingly, the spatial light modulator 11 can be densely arranged in the second direction X2 that crosses with the scan direction S. Therefore, a throughput which is the amount of information of the exposure pattern exposed in a single scan can be increased.

(2) Further, in the embodiment described above, the controller 12 includes the first controller 12A arranged on one side in the scan direction S of the spatial light modulator 11 and the second controller 12B arranged on another side.

(3) Further, in the embodiment described above, the controller 12 includes the first controller 12A arranged on the one side in the scan direction S of the spatial light modulator 11 and the third controller 12C arranged side by side in the second direction X2 that crosses with the scan direction S with respect to the first controller 12A.

(4) Further, in the embodiment described above, the spatial light modulation unit 1 includes the electric source circuit 14 connected to the electric source cable C1 connected to an outside portion of the SLM substrate 13 and the communication circuit 15 connected to the data communication cable C2 connected to an outside portion of the SLM substrate 13, and the electric source circuit 14 and the communication circuit 15 are aligned along the scan direction S with respect to the spatial light modulator 11 and the controller 12.

(5) Further, in the embodiment described above, the spatial light modulation unit 1 includes the heat sink 16, the spatial light modulator 11 is provided on the front side surface 13a of the SLM substrate 13, the controller 12 is provided on the rear side surface 13b of the SLM substrate 13, and the heat sink 16 is in contact with the controller 12.

(6) Further, in the embodiment described above, the SLM substrate 13 includes the Peltier element 17 that is arranged on the rear side surface 13b of the SLM substrate 13 and is in contact with the heat sink 16, and the spatial light modulator 11 is in contact with the Peltier element 17.

(7) Further, the intermediate portion that is in contact with the spatial light modulator 11 and the Peltier element 17 is provided, and the Peltier element 17 is in contact with the spatial light modulator 11 via the intermediate portion.

(8) Further, the spatial light modulator 11 is provided on the SLM substrate 13 such that an array direction in which the plurality of elements are arrayed is along a direction that crosses with the scan direction S.

(9) Further, the spatial light modulator 11 is provided on the SLM substrate 13 such that the array direction in which the plurality of elements are arrayed is along a direction orthogonal to the scan direction.

(10) In the embodiment described above, the spatial light modulation unit 1 is used in the exposure apparatus 100 that exposes an exposure pattern onto the photosensitive substrate 10 while moving the photosensitive substrate 10 in the scan direction S. The spatial light modulation unit 1 includes the spatial light modulator 11 having a plurality of elements, the controller 12 that controls the spatial light modulator 11 in accordance with the exposure pattern, the supply portion that supplies electric power to the spatial light modulator 11 and the controller 12, and the SLM substrate 13 on which the spatial light modulator 11 and the controller 12 are provided. The SLM substrate 13 includes: the first substrate 131 on which the spatial light modulator 11 is provided and to which a section of the supply portion is connected; and the second substrate 132 on which the controller 12 is provided and to which another section of the supply portion is connected. The second plane 132S on which the controller 12 is provided of the second substrate 132 crosses with the first plane 131S on which the spatial light modulator 11 is provided of the first substrate 131.

In the spatial light modulation unit 1 having such a configuration, even when both the spatial light modulator 11 and the controller 12 are provided on the SLM substrate 13, the size in the scan direction S can be decreased. Accordingly, the SLM substrate 13 can be densely arranged along the scan direction S. Therefore, the distance in the scan direction S required for a single scan for the illumination of the exposure pattern can be shortened, and a time for a single scan can be shortened.

(11) Further, in the embodiment described above, the SLM substrate 13 includes the bend portion 134 that is bent and connects between the first substrate 131 and the second substrate 132, and the bend portion 134 has the third plate thickness t3 that is thinner than the first plate thickness t1 of the first substrate 131 and the second plate thickness t2 of the second substrate 132.

(12) Further, in the embodiment described above, the SLM substrate 13 is formed to include the core layer 13A and the front layer 13B that covers the core layer 13A, and the core layer 13A in the bend portion 134 is exposed.

(13) Further, in the embodiment described above, the second plane 132S is perpendicular to the scan direction S.

(14) Further, in the embodiment described above, the SLM substrate 13 includes a third substrate 133, and a third plane 133S that is an extension of a front side surface 133a in the third substrate 133 crosses with at least one of the first plane 131S and the second plane 132S.

(15) Further, in the embodiment described above, the spatial light modulation unit 1 includes the heat sink 16, the spatial light modulator 11 is provided on the front side surface 131a of the SLM substrate 13, the controller 12 is provided on the rear side surface 131b of the SLM substrate 13, and the heat sink 16 is in contact with the controller 12.

(16) Further, in the embodiment described above, the SLM substrate 13 includes the Peltier element 17 that is arranged on the rear side surface 131b of the SLM substrate 13 and is in contact with the heat sink 16, and the spatial light modulator 11 is in contact with the Peltier element 17.

(17) Further, in the embodiment described above, the intermediate portion that is in contact with the spatial light modulator 11 and the Peltier element 17 is provided, and the Peltier element 17 is in contact with the spatial light modulator 11 via the intermediate portion.

(18) In the embodiment described above, the spatial light modulation unit 1 is used in an exposure apparatus that exposes an exposure pattern onto the photosensitive substrate 10 while moving the photosensitive substrate 10 in the scan direction S. The spatial light modulation unit 1 includes: the spatial light modulator 11 having a plurality of elements; the controller 12 that controls the spatial light modulator 11 in accordance with the exposure pattern; the SLM substrate 13 on which the spatial light modulator 11 and the controller 12 are provided; and the heat sink 16. The spatial light modulator 11 is provided on the front side surface 131a of the SLM substrate 13, the controller 12 is provided on the rear side surface 131b of the SLM substrate 13, and the heat sink 16 is in contact with the controller 12.

(19) Further, in the embodiment described above, the SLM substrate 13 includes the Peltier element 17 that is arranged on the rear side surface 131b of the SLM substrate 13 and is in contact with the heat sink 16, and the spatial light modulator 11 is in contact with the Peltier element 17.

(20) Further, in the embodiment described above, the intermediate portion that is in contact with the spatial light modulator 11 and the Peltier element 17 is provided. The Peltier element 17 is in contact with the spatial light modulator 11 via the intermediate portion.

(21) Further, in the embodiment described above, the heat sink 16 is supported by the SLM stage 18 that is rotatable around the reference axis P orthogonal to the reflection surface of the spatial light modulator 11.

(22) Further, in the embodiment described above, the heat sink 16 is supported by the SLM stage 18 that is movable in the scan direction S and the second direction X2 that crosses with the scan direction S along the photosensitive surface 10a of the photosensitive substrate 10.

(23) Further, in the embodiment described above, the heat sink 16 is supported by the SLM stage 18 that is movable at six degrees of freedom.

(24) Further, in the embodiment described above, the heat sink 16 includes the flow passage 16T through which a refrigerant passes, and the spatial light modulator 11 is arranged on a further upstream side of the flow passage 16T than the controller 12.

(25) Further, in the embodiment described above, the exposure apparatus 100 includes: the spatial light modulation unit 1 that includes the spatial light modulator 11 having a plurality of elements, the controller 12 that controls the plurality of elements, and the SLM substrate 13 on which the spatial light modulator 11 and the controller 12 are provided; the substrate stage 4 that holds the photosensitive substrate 10 and moves in the scan direction S relative to the spatial light modulation unit 1; and a projection optical system that projects an image of a pattern formed by the plurality of elements controlled by the controller 12 onto the photosensitive substrate 10. The controller 12 is provided on the SLM substrate 13 side by side in the scan direction S with respect to the spatial light modulator 11.

(26) In the embodiment described above, the exposure apparatus 100 exposes a substrate while moving the substrate in a scan direction. The exposure apparatus 100 includes: the illumination optical system (illumination module) 7A; the spatial light modulator 11 that is illuminated with light from the illumination optical system 7A; the projection optical system (projection module) 7B that illuminates the substrate with light emitted from the spatial light modulator 11; and the stage 4 that holds the substrate and moves in the scan direction. The illumination optical system 7A and the spatial light modulator 11 are arranged side by side in the scan direction S.

(27) In the embodiment described above, the exposure apparatus 100 includes: the stage 4 that moves a substrate in the scan direction S; the spatial light modulator 11; the illumination optical system (illumination module) 7A that illuminates the spatial light modulator 11; and the projection optical system (projection module) 7B that illuminates the substrate with light reflected by the mirror of the spatial light modulator 11. A plane including the optical axis of illumination light that illuminates the spatial light modulator 11 and the optical axis of the projection optical system (projection module) 7B is provided in parallel with the scan direction S.

(28) Further, in the embodiment described above, the mirror of the spatial light modulator 11 is tilted relative to the scan direction S.

Although embodiments of the present invention has been described in detail with reference to the drawings, the specific configuration is not limited to those described above, and various design changes or the like can be made without departing from the scope of the present invention.

What is claimed is:

1. An exposure apparatus that exposes an exposure pattern onto a photosensitive substrate while moving the photosensitive substrate in a scan direction, the exposure apparatus comprising:
   a first spatial light modulation unit including:
      a first spatial light modulator including a plurality of first elements controlled in accordance with the exposure pattern; and
      one of a first electric source circuit and a first controller that controls the plurality of first elements;
   a first projection optical system that irradiates the photosensitive substrate with light from the first spatial light modulator;
   a second spatial light modulation unit including:
      a second spatial light modulator including a plurality of second elements controlled in accordance with the exposure pattern; and
      one of a second electric source circuit and a second controller that controls the plurality of second elements;
   a second projection optical system that irradiates the photosensitive substrate with light from the second spatial light modulator;
   a first illumination optical system including:
      a first lens that guides incident light downward; and
      a first mirror that guides light passed through the first lens to the plurality of first elements; and
   a second illumination optical system including:
      a second lens that guides incident light downward; and
      a second mirror that guides light passed through the second lens to the plurality of second elements, wherein
   the first lens of the first illumination optical system is located at a position lower than the first spatial light modulator,
   the second lens of the second illumination optical system is located at a position lower than the second spatial light modulator, in a plan view,
      the first lens of the first illumination optical system and the first spatial light modulator are arranged in the scan direction without overlapping each other,
      the second lens of the second illumination optical system and the second spatial light modulator are arranged in the scan direction without overlapping each other,
      the first projection optical system and the second projection optical system are arranged in a first direction that crosses the scan direction, and
      the first spatial light modulator and the one of the first electric source circuit and the first controller are arranged in the scan direction or in a second direction closer to the scan direction than the first direction.

2. The exposure apparatus according to claim 1, wherein the first controller includes a one side controller arranged on one side in the second direction of the first spatial light modulator and an other side controller arranged on the other side in the second direction of the first spatial light modulator, or includes the one side controller and a controller arranged with the one side controller in a direction crossing with the second direction.

3. The exposure apparatus according to claim 1, wherein the first spatial light modulation unit includes a first substrate on which the first electric source circuit and a communication circuit are provided,
   the first electric source circuit is connected to an electric source cable connected to an outside portion of the first substrate,
   the communication circuit is connected to a data communication cable connected to an outside portion of the first substrate, and
   the first electric source circuit and the communication circuit are arranged in the second direction.

4. The exposure apparatus according to claim 1, wherein the first spatial light modulation unit includes a heat sink that cools the first controller,
   the first spatial light modulator is mounted on a front side of a first substrate, the front side of the first substrate is a side from which light from the first spatial light modulator is emitted, and
   the first controller is provided on a rear side of the first substrate.

5. The exposure apparatus according to claim 4, wherein the first spatial light modulator is cooled through a Peltier element provided on the rear side of the first substrate, or through the Peltier element and an intermediate portion between the first spatial light modulator and the Peltier element.

6. The exposure apparatus according to claim 1, further comprising:
   a stage that moves the photosensitive substrate in the scan direction relative to the first projection optical system and the second projection optical system,
   wherein the first spatial light modulator is provided on a first substrate such that an array direction in which the plurality of first elements are arrayed crosses with the scan direction in a plan view.

7. A spatial light modulation unit used in an exposure apparatus that exposes an exposure pattern onto a photosensitive substrate while moving the photosensitive substrate in a scan direction, the spatial light modulation unit comprising:

a spatial light modulator including a plurality of elements;

a controller that controls the plurality of elements in accordance with the exposure pattern;

a supply portion that supplies electric power to the spatial light modulator and the controller; and a SLM substrate on which the spatial light modulator and the controller are provided, wherein the SLM substrate includes:

a first substrate on which the spatial light modulator is provided and to which a part of the supply portion is connected; and a second substrate on which the controller is provided and to which another part of the supply portion is connected, and wherein a second plane of the second substrate on which the controller is provided crosses a first plane of the first substrate on which the spatial light modulator is provided.

8. The spatial light modulation unit according to claim 7, wherein the SLM substrate includes a bend portion that connects the first substrate and the second substrate to each other, and the bend portion has a plate thickness that is thinner than a plate thickness of the first substrate and a plate thickness of the second substrate.

9. The spatial light modulation unit according to claim 8, wherein the SLM substrate includes a core layer and a surface layer that covers the core layer, and the core layer in the bend portion is exposed.

10. The spatial light modulation unit according to claim 7, wherein the second plane is perpendicular to the scan direction.

11. The spatial light modulation unit according to claim 7, wherein the SLM substrate includes a third substrate, and a plane including a front side surface in the third substrate crosses with at least one of the first plane and the second plane.

12. The spatial light modulation unit according to claim 7, further comprising:

a heat sink that cools the controller, wherein a front side of the SLM substrate is a side from which light from the spatial light modulator is emitted, and the controller is provided on a rear side of the SLM substrate.

13. The spatial light modulation unit according to claim 12, wherein the spatial light modulator is cooled through a Peltier element provided on the rear side of the SLM substrate, or through the Peltier element and an intermediate portion between the spatial light modulator and the Peltier element.

14. An exposure apparatus that exposes an exposure pattern onto a photosensitive substrate while moving the photosensitive substrate in a scan direction, the exposure apparatus comprising:

a spatial light modulator including a plurality of elements;

a controller that controls the plurality of elements in accordance with the exposure pattern;

a SLM substrate on which the spatial light modulator and the controller are provided;

a heat sink that cools the controller, an illumination optical system including:

a lens that guides incident light downward; and a mirror that guides light passed through the lens to the plurality of elements, wherein the lens of the illumination optical system is located at a position lower than the spatial light modulator, in a plan view, the lens of the illumination optical system and the spatial light modulator are arranged in the scan direction without overlapping each other, light from the spatial light modulator is emitted from a front side of the SLM substrate, and the controller is provided on a rear side of the SLM substrate.

15. The exposure apparatus according to claim 14, wherein the spatial light modulator is cooled through a Peltier element provided on the rear side of the SLM substrate, or through the Peltier element and an intermediate portion between the spatial light modulator and the Peltier element.

16. The exposure apparatus according to claim 14, wherein the heat sink is supported by a SLM stage that is rotatable around a reference axis orthogonal to a reflection surface of the spatial light modulator and is movable in the scan direction and a direction that crosses with the scan direction along a photosensitive surface of the photosensitive substrate.

17. The exposure apparatus according to claim 14, wherein the heat sink is supported by a SLM stage that is movable at six degrees of freedom.

18. The exposure apparatus according to claim 14, wherein the heat sink includes a flow passage through which a refrigerant passes, and the spatial light modulator is arranged on a further upstream side of the flow passage than the controller.

19. An exposure apparatus comprising:

a first substrate on which are provided:

a first spatial light modulator including a plurality of first elements, and;

a controller that controls the plurality of first elements;

a stage including a top surface configured to hold an object, the stage is located below the first spatial light modulator and is movable in a first direction and a second direction intersecting the first direction relative to the first spatial light modulator; and a first illumination optical system including:

a first lens that guides incident light downward; and a first mirror that guides light passed through the first lens to the plurality of first elements, wherein the first lens of the first illumination optical system is located at a position lower than the first spatial light modulator, in a plan view, the first lens of the first illumination optical system and the first spatial light modulator are arranged in the first direction without overlapping each other, and in the plan view, the controller and the first spatial light modulator are arranged in the first direction or in a direction closer to the first direction than the second direction.

20. The exposure apparatus according to claim 19, further comprising:

a second substrate on which a second spatial light modulator including a plurality of second elements and a second controller that controls the plurality of second elements are provided;

a second illumination optical system including:
  a second lens that guides incident light downward; and
  a second mirror that guides light passed through the second lens to the plurality of second elements;
a first projection optical system that demagnifies and projects light from the plurality of first elements onto the object; and
a second projection optical system that demagnifies and projects light from the plurality of second elements onto the object, wherein
the plurality of first elements is a plurality of first mirrors controlled to a plurality of states in accordance with an exposure pattern,
the plurality of states includes:
  a first state in which light from the plurality of first mirrors enters the first projection optical system; and
  a second state in which light from the plurality of first mirrors enters other than the first projection optical system,
the plurality of first mirrors is arranged in a first array direction and a second array direction intersecting the first array direction, and
in a plan view, the first array direction intersects the first direction.

21. An exposure apparatus comprising:
a first substrate on which a first spatial light modulator including a plurality of first elements is provided;
a first illumination optical system including:
  a fly eye lens;
  a first lens that guides light passed through the fly eye lens downward; and
  a first mirror that guides light passed through the first lens to the plurality of first elements; and
a stage including a top surface configured to hold an object, the stage is located below the first spatial light modulator and is movable in a first direction and a second direction intersecting the first direction relative to the first spatial light modulator, wherein
the first lens of the first illumination optical system is located at a position lower than the first spatial light modulator, and
in a plan view, the first lens of the first illumination optical system and the first spatial light modulator are arranged in the first direction without overlapping each other.

22. The exposure apparatus according to claim 21, further comprising:
a second substrate on which a second spatial light modulator including a plurality of second elements are provided;
a second illumination optical system including:
  a second lens that guides incident light downward; and
  a second mirror that guides light passed through the second lens to the plurality of second elements;
a first projection optical system that demagnifies and projects light from the plurality of first elements onto the object; and
a second projection optical system that demagnifies and projects light from the plurality of second elements onto the object, wherein
the plurality of first elements is a plurality of first mirrors controlled to a plurality of states in accordance with an exposure pattern,
the plurality of states includes:
  a first state in which light from the plurality of first mirrors enters the first projection optical system; and a second state in which light from the plurality of first mirrors enters other than the first projection optical system,
the plurality of first mirrors is arranged in a first array direction and a second array direction intersecting the first array direction, and
in a plan view, the first array direction intersects the first direction.

23. An exposure apparatus comprising:
a first substrate on which a first spatial light modulator including a plurality of first elements is provided;
a second substrate on which a second spatial light modulator including a plurality of second elements is provided;
a stage including a top surface configured to hold an object, the stage is located below the first spatial light modulator and the second spatial light modulator and is movable in a first direction and a second direction intersecting the first direction relative to the first spatial light modulator and the second spatial light modulator;
a first illumination optical system including:
  a first lens that guides incident light downward; and
  a first mirror that guides light passed through the first lens to the plurality of first elements; and
a second illumination optical system including:
  a second lens that guides incident light downward; and
  a second mirror that guides light passed through the second lens to the plurality of second elements, wherein
the first spatial light modulator and the second spatial light modulator are arranged in the second direction,
the first lens of the first illumination optical system is located at a position lower than the first spatial light modulator,
the second lens of the second illumination optical system is located at a position lower than the second spatial light modulator,
in a plan view, the first lens of the first illumination optical system and the first spatial light modulator are arranged in the first direction without overlapping each other,
in the plan view, the second lens of the second illumination optical system and the second spatial light modulator are arranged in the first direction without overlapping each other,
a longitudinal direction of the first substrate extends in the first direction or in a direction closer to the first direction than the second direction, and
a longitudinal direction of the second substrate extends in the first direction or in a direction closer to the first direction than the second direction.

24. The exposure apparatus according to claim 23, wherein
the first substrate is provided with one of an electric source circuit and a controller that controls the first spatial light modulator, and
the first spatial light modulator and the one of the electric source circuit and the controller are arranged in the longitudinal direction of the first substrate.

25. The exposure apparatus according to claim 24, wherein
the first spatial light modulator is provided on a first surface of the first substrate,
the one of the electric source circuit and the controller is provided on a first surface of a third substrate connected to the first substrate, and a plane including the first surface of the first substrate crosses with a plane including the first surface of the third substrate.

26. The exposure apparatus according to claim 23, further comprising:

a first projection optical system that demagnifies and projects light from the plurality of first elements onto the object; and a second projection optical system that demagnifies and projects light from the plurality of second elements onto the object, wherein the plurality of first elements is a plurality of first mirrors controlled to a plurality of states in accordance with an exposure pattern, the plurality of states includes:

a first state in which light from the plurality of first mirrors enters the first projection optical system; and a second state in which light from the plurality of first mirrors enters other than the first projection optical system, the plurality of first mirrors is arranged in a first array direction and a second array direction intersecting the first array direction, and in a plan view, the first array direction intersects the first direction.

* * * * *